(12) United States Patent
Haba et al.

(10) Patent No.: US 8,461,672 B2
(45) Date of Patent: Jun. 11, 2013

(54) RECONSTITUTED WAFER STACK PACKAGING WITH AFTER-APPLIED PAD EXTENSIONS

(75) Inventors: Belgacem Haba, Saratoga, CA (US); Giles Humpston, Buckinghamshire (GB); David Ovrutsky, Charlotte, NC (US); Laura Mirkarimi, Sunol, CA (US)

(73) Assignee: Tessera, Inc., San Jose, CA (US)

( * ) Notice: Subject to any disclaimer, the term of this patent is extended or adjusted under 35 U.S.C. 154(b) by 210 days.

(21) Appl. No.: 12/670,952

(22) PCT Filed: Jul. 25, 2008

(86) PCT No.: PCT/US2008/009207
§ 371 (c)(1),
(2), (4) Date: May 14, 2010

(87) PCT Pub. No.: WO2009/017758
PCT Pub. Date: Feb. 5, 2009

(65) Prior Publication Data
US 2011/0006432 A1    Jan. 13, 2011

Related U.S. Application Data

(60) Provisional application No. 60/962,200, filed on Jul. 27, 2007.

(51) Int. Cl.
*H01L 23/02* (2006.01)
(52) U.S. Cl.
USPC ...... 257/686; 257/E23.178; 257/98; 257/685; 257/777; 438/109; 438/110
(58) Field of Classification Search
USPC ............ 257/E21.499, E23.169, E23.019, 257/E23.142, E23.178, E23.085, 94, 95, 257/99, 103, 685, 686, 758, 773, 777, 781, 786; 438/107, 109, 110, 113, 462
See application file for complete search history.

(56) References Cited

U.S. PATENT DOCUMENTS

| 4,074,342 | A | 2/1978 | Honn et al. |
| 4,500,905 | A | 2/1985 | Shibata |

(Continued)

FOREIGN PATENT DOCUMENTS

| CN | 1913149 A | 2/2007 |
| DE | 19516487 C1 | 7/1996 |

(Continued)

OTHER PUBLICATIONS

International Search Report and Written Opinion, PCT/US2008/009353, dated Feb. 10, 2009.

(Continued)

*Primary Examiner* — Chris Chu
(74) *Attorney, Agent, or Firm* — Lerner, David, Littenberg, Krumholz & Mentlik, LLP

(57) ABSTRACT

A stacked microelectronic unit is provided which can include a plurality of vertically stacked microelectronic elements (12, 12A) each having a front surface (117), contacts (22) exposed at the front surface, a rear surface (118) and edges (18, 20) extending between the front and rear surfaces. Traces (24) connected with the contacts may extend along the front surfaces towards edges of the microelectronic elements with the rear surface of at least one of the stacked microelectronic elements being adjacent to a top face (90) of the microelectronic unit. A plurality of conductors (66) may extend along edges of the microelectronic elements from the traces (24) to the top face (90). The conductors may be conductively connected with unit contacts (76) such that the unit contacts overlie the rear surface (118) of the at least one microelectronic element (12A) adjacent to the top face.

38 Claims, 13 Drawing Sheets

U.S. PATENT DOCUMENTS

| | | | |
|---|---|---|---|
| 4,765,864 A | 8/1988 | Holland et al. |
| 4,842,699 A | 6/1989 | Hua et al. |
| 4,897,708 A | 1/1990 | Clements |
| 4,954,875 A | 9/1990 | Clements |
| 5,322,816 A | 6/1994 | Pinter |
| 5,343,071 A | 8/1994 | Kazior et al. |
| 5,412,539 A | 5/1995 | Elwell et al. |
| 5,424,245 A | 6/1995 | Gurtler et al. |
| 5,426,072 A | 6/1995 | Finnila |
| 5,466,634 A | 11/1995 | Beilstein, Jr. et al. |
| 5,563,084 A | 10/1996 | Ramm et al. |
| 5,571,754 A | 11/1996 | Bertin et al. |
| 5,604,673 A | 2/1997 | Washburn et al. |
| 5,608,264 A | 3/1997 | Gaul |
| 5,614,766 A | 3/1997 | Takasu et al. |
| 5,618,752 A | 4/1997 | Gaul |
| 5,646,067 A | 7/1997 | Gaul |
| 5,656,553 A | 8/1997 | Leas et al. |
| 5,661,087 A | 8/1997 | Pedersen et al. |
| 5,682,062 A | 10/1997 | Gaul |
| 5,716,759 A | 2/1998 | Badehi |
| 5,766,984 A | 6/1998 | Ramm et al. |
| 5,767,001 A | 6/1998 | Bertagnolli et al. |
| 5,804,004 A | 9/1998 | Tuckerman et al. |
| 5,814,889 A | 9/1998 | Gaul |
| 5,817,530 A | 10/1998 | Ball |
| 5,880,010 A | 3/1999 | Davidson |
| 5,915,167 A | 6/1999 | Leedy |
| 5,946,545 A | 8/1999 | Bertin et al. |
| 5,973,386 A | 10/1999 | Horikawa |
| 6,002,167 A | 12/1999 | Hatano et al. |
| 6,022,758 A | 2/2000 | Badehi |
| 6,031,274 A | 2/2000 | Muramatsu et al. |
| 6,040,235 A | 3/2000 | Badehi |
| 6,103,552 A | 8/2000 | Lin |
| 6,130,823 A | 10/2000 | Lauder et al. |
| 6,133,640 A | 10/2000 | Leedy |
| 6,177,707 B1 | 1/2001 | Dekker et al. |
| 6,177,721 B1 | 1/2001 | Suh et al. |
| 6,188,129 B1 | 2/2001 | Paik et al. |
| 6,204,562 B1 | 3/2001 | Ho et al. |
| 6,208,545 B1 | 3/2001 | Leedy |
| 6,228,686 B1 | 5/2001 | Smith et al. |
| 6,252,305 B1 | 6/2001 | Lin et al. |
| 6,261,865 B1 | 7/2001 | Akram |
| 6,277,669 B1 | 8/2001 | Kung et al. |
| 6,340,845 B1 | 1/2002 | Oda |
| 6,344,401 B1 | 2/2002 | Lam |
| 6,396,710 B1 | 5/2002 | Iwami et al. |
| 6,472,247 B1 | 10/2002 | Andoh et al. |
| 6,472,293 B1 | 10/2002 | Suga |
| 6,486,546 B2 | 11/2002 | Moden et al. |
| 6,492,201 B1 | 12/2002 | Haba |
| 6,498,381 B2 | 12/2002 | Halahan et al. |
| 6,498,387 B1 | 12/2002 | Yang |
| 6,548,391 B1 | 4/2003 | Ramm et al. |
| 6,551,857 B2 | 4/2003 | Leedy |
| 6,562,653 B1 | 5/2003 | Ma et al. |
| 6,563,224 B2 | 5/2003 | Leedy |
| 6,582,991 B1 | 6/2003 | Maeda et al. |
| 6,607,938 B2 | 8/2003 | Kwon et al. |
| 6,607,941 B2 | 8/2003 | Prabhu et al. |
| 6,608,377 B2 | 8/2003 | Chang et al. |
| 6,611,052 B2 | 8/2003 | Poo et al. |
| 6,621,155 B1 | 9/2003 | Perino et al. |
| 6,624,505 B2 * | 9/2003 | Badehi ................. 257/678 |
| 6,632,706 B1 | 10/2003 | Leedy |
| 6,646,289 B1 | 11/2003 | Badehi |
| 6,656,827 B1 | 12/2003 | Tsao et al. |
| 6,693,358 B2 | 2/2004 | Yamada et al. |
| 6,717,254 B2 | 4/2004 | Siniaguine |
| 6,727,576 B2 | 4/2004 | Hedler et al. |
| 6,730,997 B2 | 5/2004 | Beyne et al. |
| 6,737,300 B2 | 5/2004 | Ding et al. |
| 6,743,660 B2 | 6/2004 | Lee et al. |
| 6,753,205 B2 | 6/2004 | Halahan |
| 6,753,208 B1 | 6/2004 | MacIntyre |
| 6,777,767 B2 | 8/2004 | Badehi |
| 6,784,023 B2 | 8/2004 | Ball |
| 6,806,559 B2 | 10/2004 | Gann et al. |
| 6,828,175 B2 | 12/2004 | Wood et al. |
| 6,844,241 B2 | 1/2005 | Halahan et al. |
| 6,844,619 B2 | 1/2005 | Tago |
| 6,864,172 B2 | 3/2005 | Noma et al. |
| 6,867,123 B2 | 3/2005 | Katagiri et al. |
| 6,870,249 B2 | 3/2005 | Egawa |
| 6,878,608 B2 | 4/2005 | Brofman et al. |
| 6,897,148 B2 | 5/2005 | Halahan et al. |
| 6,958,285 B2 | 10/2005 | Siniaguine |
| 6,972,480 B2 | 12/2005 | Zilber et al. |
| 6,972,483 B1 | 12/2005 | Song |
| 6,982,475 B1 | 1/2006 | MacIntyre |
| 6,984,545 B2 | 1/2006 | Grigg et al. |
| 6,984,885 B1 | 1/2006 | Harada et al. |
| 7,001,825 B2 | 2/2006 | Halahan et al. |
| 7,005,324 B2 | 2/2006 | Imai |
| 7,034,401 B2 | 4/2006 | Savastiouk et al. |
| 7,049,170 B2 | 5/2006 | Savastiouk et al. |
| 7,060,601 B2 | 6/2006 | Savastiouk et al. |
| 7,087,459 B2 | 8/2006 | Koh |
| 7,115,986 B2 | 10/2006 | Moon et al. |
| 7,138,295 B2 | 11/2006 | Leedy |
| 7,160,753 B2 | 1/2007 | Williams, Jr. |
| 7,186,586 B2 | 3/2007 | Savastiouk et al. |
| 7,192,796 B2 | 3/2007 | Zilber et al. |
| 7,193,239 B2 | 3/2007 | Leedy |
| 7,208,343 B2 | 4/2007 | Song et al. |
| 7,208,345 B2 | 4/2007 | Meyer et al. |
| 7,215,018 B2 | 5/2007 | Vindasius et al. |
| 7,241,641 B2 | 7/2007 | Savastiouk et al. |
| 7,241,675 B2 | 7/2007 | Savastiouk et al. |
| 7,285,865 B2 * | 10/2007 | Kwon et al. .................. 257/777 |
| 7,312,521 B2 | 12/2007 | Noma et al. |
| 7,394,152 B2 * | 7/2008 | Yu et al. ........................ 257/690 |
| 7,408,249 B2 * | 8/2008 | Badihi ........................ 257/678 |
| 7,474,004 B2 | 1/2009 | Leedy |
| 7,495,316 B2 | 2/2009 | Kirby et al. |
| 7,498,661 B2 | 3/2009 | Matsuo |
| 7,504,732 B2 | 3/2009 | Leedy |
| 7,510,928 B2 | 3/2009 | Savastiouk et al. |
| 7,521,360 B2 | 4/2009 | Halahan et al. |
| 7,622,810 B2 | 11/2009 | Takao |
| 7,662,710 B2 | 2/2010 | Shiv |
| 7,663,213 B2 * | 2/2010 | Yu et al. ........................ 257/678 |
| 7,705,466 B2 | 4/2010 | Leedy |
| 7,719,102 B2 * | 5/2010 | Noma et al. .................. 257/697 |
| 7,759,166 B2 | 7/2010 | Haba et al. |
| 7,829,438 B2 * | 11/2010 | Haba et al. .................. 438/462 |
| 7,859,115 B2 | 12/2010 | Kim et al. |
| 7,884,459 B2 | 2/2011 | Yoshida et al. |
| 7,901,989 B2 | 3/2011 | Haba et al. |
| 7,944,015 B2 * | 5/2011 | Kitagawa et al. ............. 257/435 |
| 7,952,195 B2 | 5/2011 | Haba |
| 7,973,416 B2 | 7/2011 | Chauhan |
| 8,022,527 B2 * | 9/2011 | Haba et al. .................. 257/686 |
| 8,043,895 B2 | 10/2011 | Haba et al. |
| 8,076,788 B2 * | 12/2011 | Haba et al. .................. 257/786 |
| 8,357,999 B2 | 1/2013 | Robinson et al. |
| 2001/0024839 A1 | 9/2001 | Lin |
| 2001/0048151 A1 | 12/2001 | Chun |
| 2002/0047199 A1 | 4/2002 | Ohuchi et al. |
| 2002/0074637 A1 | 6/2002 | McFarland |
| 2002/0109236 A1 | 8/2002 | Kim et al. |
| 2002/0113303 A1 | 8/2002 | Murayama |
| 2002/0127775 A1 | 9/2002 | Haba et al. |
| 2002/0132465 A1 | 9/2002 | Leedy |
| 2002/0171145 A1 | 11/2002 | Higuchi et al. |
| 2003/0006494 A1 | 1/2003 | Lee et al. |
| 2003/0060034 A1 | 3/2003 | Beyne et al. |
| 2003/0094654 A1 | 5/2003 | Poo et al. |
| 2003/0134453 A1 * | 7/2003 | Prabhu et al. .................. 438/113 |
| 2003/0173608 A1 | 9/2003 | Leedy |
| 2003/0209772 A1 | 11/2003 | Prabhu |
| 2003/0233704 A1 | 12/2003 | Castellote |
| 2004/0014255 A1 | 1/2004 | Grigg et al. |
| 2004/0016942 A1 | 1/2004 | Miyazawa et al. |
| 2004/0070063 A1 | 4/2004 | Leedy |

| | | |
|---|---|---|
| 2004/0082114 A1 | 4/2004 | Horng |
| 2004/0104454 A1 | 6/2004 | Takaoka et al. |
| 2004/0142509 A1* | 7/2004 | Imai .................... 438/109 |
| 2004/0155326 A1 | 8/2004 | Kanbayashi |
| 2004/0155354 A1 | 8/2004 | Hanaoka et al. |
| 2004/0169278 A1 | 9/2004 | Kinsman |
| 2004/0221451 A1 | 11/2004 | Chia et al. |
| 2004/0222508 A1 | 11/2004 | Aoyagi |
| 2004/0251525 A1 | 12/2004 | Zilber et al. |
| 2005/0003649 A1 | 1/2005 | Takao |
| 2005/0012225 A1 | 1/2005 | Choi et al. |
| 2005/0046002 A1 | 3/2005 | Lee et al. |
| 2005/0051883 A1 | 3/2005 | Fukazawa |
| 2005/0056903 A1 | 3/2005 | Yamamoto et al. |
| 2005/0067680 A1 | 3/2005 | Boon et al. |
| 2005/0073035 A1 | 4/2005 | Moxham |
| 2005/0095835 A1 | 5/2005 | Humpston et al. |
| 2005/0104179 A1 | 5/2005 | Zilber et al. |
| 2005/0156330 A1 | 7/2005 | Harris |
| 2005/0260794 A1 | 11/2005 | Lo et al. |
| 2005/0263866 A1 | 12/2005 | Wan |
| 2005/0287783 A1 | 12/2005 | Kirby et al. |
| 2006/0006488 A1 | 1/2006 | Kanbe |
| 2006/0017161 A1 | 1/2006 | Chung et al. |
| 2006/0043556 A1 | 3/2006 | Su et al. |
| 2006/0043598 A1 | 3/2006 | Kirby et al. |
| 2006/0043601 A1 | 3/2006 | Pahl |
| 2006/0046348 A1 | 3/2006 | Kang |
| 2006/0046471 A1 | 3/2006 | Kirby et al. |
| 2006/0055050 A1 | 3/2006 | Numata et al. |
| 2006/0055061 A1 | 3/2006 | Hosokawa et al. |
| 2006/0068580 A1 | 3/2006 | Dotta |
| 2006/0076670 A1 | 4/2006 | Lim et al. |
| 2006/0079019 A1 | 4/2006 | Kim |
| 2006/0094165 A1 | 5/2006 | Hedler et al. |
| 2006/0115932 A1 | 6/2006 | Farnworth et al. |
| 2006/0121645 A1 | 6/2006 | Ball |
| 2006/0138626 A1 | 6/2006 | Liew et al. |
| 2006/0175697 A1 | 8/2006 | Kurosawa et al. |
| 2006/0220234 A1 | 10/2006 | Honer et al. |
| 2006/0220262 A1 | 10/2006 | Meyer et al. |
| 2006/0249829 A1 | 11/2006 | Katagiri et al. |
| 2006/0258044 A1 | 11/2006 | Meyer et al. |
| 2006/0292866 A1 | 12/2006 | Borwick et al. |
| 2007/0007556 A1 | 1/2007 | Shibayama |
| 2007/0035001 A1 | 2/2007 | Kuhmann et al. |
| 2007/0037379 A1 | 2/2007 | Enquist et al. |
| 2007/0045803 A1 | 3/2007 | Ye et al. |
| 2007/0045862 A1 | 3/2007 | Corisis et al. |
| 2007/0052050 A1 | 3/2007 | Dierickx |
| 2007/0102802 A1 | 5/2007 | Kang et al. |
| 2007/0126085 A1 | 6/2007 | Kawano et al. |
| 2007/0132082 A1 | 6/2007 | Tang et al. |
| 2007/0138498 A1* | 6/2007 | Zilber et al. .................... 257/99 |
| 2007/0148941 A1 | 6/2007 | Haba et al. |
| 2007/0158807 A1 | 7/2007 | Lu et al. |
| 2007/0181989 A1 | 8/2007 | Corisis et al. |
| 2007/0190747 A1 | 8/2007 | Humpston et al. |
| 2007/0249095 A1 | 10/2007 | Song et al. |
| 2007/0257350 A1 | 11/2007 | Lee et al. |
| 2008/0083976 A1* | 4/2008 | Haba et al. .................... 257/686 |
| 2008/0083977 A1* | 4/2008 | Haba et al. .................... 257/686 |
| 2008/0090333 A1 | 4/2008 | Haba et al. |
| 2008/0099900 A1 | 5/2008 | Oganesian et al. |
| 2008/0099907 A1 | 5/2008 | Oganesian et al. |
| 2008/0116544 A1 | 5/2008 | Grinman et al. |
| 2008/0116545 A1 | 5/2008 | Grinman et al. |
| 2008/0122113 A1 | 5/2008 | Corisis et al. |
| 2008/0157327 A1 | 7/2008 | Yang |
| 2008/0166836 A1 | 7/2008 | Jobetto |
| 2008/0246136 A1 | 10/2008 | Haba et al. |
| 2008/0284041 A1 | 11/2008 | Jang et al. |
| 2008/0308921 A1 | 12/2008 | Kim |
| 2008/0315407 A1 | 12/2008 | Andrews, Jr. et al. |
| 2009/0009491 A1 | 1/2009 | Grivna |
| 2009/0032966 A1 | 2/2009 | Lee et al. |
| 2009/0039528 A1* | 2/2009 | Haba et al. .................... 257/777 |
| 2009/0065907 A1 | 3/2009 | Haba et al. |
| 2009/0067135 A1 | 3/2009 | Hirai |
| 2009/0067210 A1 | 3/2009 | Leedy |
| 2009/0121323 A1 | 5/2009 | Kwon et al. |
| 2009/0160065 A1* | 6/2009 | Haba et al. .................... 257/777 |
| 2009/0166840 A1 | 7/2009 | Kang et al. |
| 2009/0166846 A1 | 7/2009 | Pratt et al. |
| 2009/0174082 A1 | 7/2009 | Leedy |
| 2009/0175104 A1 | 7/2009 | Leedy |
| 2009/0212381 A1 | 8/2009 | Crisp et al. |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2009/0309235 A1 | 12/2009 | Suthiwongsunthorn et al. |
| 2009/0316378 A1 | 12/2009 | Haba et al. |
| 2010/0053407 A1 | 3/2010 | Crisp et al. |
| 2010/0065949 A1 | 3/2010 | Thies et al. |
| 2010/0164086 A1 | 7/2010 | Noma et al. |
| 2010/0200966 A1 | 8/2010 | Karnezos |
| 2010/0219523 A1 | 9/2010 | Chow et al. |
| 2010/0225006 A1 | 9/2010 | Haba et al. |
| 2010/0230795 A1 | 9/2010 | Kriman et al. |
| 2011/0006432 A1 | 1/2011 | Haba et al. |
| 2011/0024890 A1 | 2/2011 | Yang et al. |
| 2011/0039370 A1 | 2/2011 | Gomyo et al. |
| 2011/0198722 A1 | 8/2011 | Suh |
| 2011/0248410 A1 | 10/2011 | Avsian et al. |
| 2012/0025364 A1 | 2/2012 | Hoshino et al. |

FOREIGN PATENT DOCUMENTS

| | | |
|---|---|---|
| DE | 102004039906 A1 | 8/2005 |
| EP | 0926723 A1 | 6/1999 |
| EP | 1041624 A1 | 10/2000 |
| EP | 1482553 A2 | 12/2004 |
| EP | 1519410 A1 | 3/2005 |
| EP | 1619722 A1 | 1/2006 |
| EP | 1653510 A2 | 5/2006 |
| EP | 1686627 A1 | 8/2006 |
| EP | 1 741 668 A2 | 1/2007 |
| EP | 1801866 A2 | 6/2007 |
| FR | 2704690 A1 | 11/1994 |
| JP | 60160645 A | 8/1985 |
| JP | 07-509104 A | 10/1995 |
| JP | 08306724 A | 11/1996 |
| JP | 09045848 A | 2/1997 |
| JP | 2001015683 A | 1/2001 |
| JP | 2001035995 A | 2/2001 |
| JP | 2001-217386 A | 8/2001 |
| JP | 2001210782 A | 8/2001 |
| JP | 2002093944 A | 3/2002 |
| JP | 2003-037758 A | 2/2003 |
| JP | 2003163324 A | 6/2003 |
| JP | 2004063569 A | 2/2004 |
| JP | 2004119473 A | 4/2004 |
| JP | 2004153130 A | 5/2004 |
| JP | 2004158536 A | 6/2004 |
| JP | 2005101067 A | 4/2005 |
| JP | 2005303031 A | 10/2005 |
| KR | 2006-0020822 A | 3/2006 |
| TW | I289936 | 4/2004 |
| WO | 9425987 A1 | 11/1994 |
| WO | 9845130 A1 | 10/1998 |
| WO | 9940624 A1 | 8/1999 |
| WO | 2004/025727 A1 | 3/2004 |
| WO | 2004114397 | 12/2004 |
| WO | 2005081315 A2 | 9/2005 |
| WO | 2006027981 A1 | 3/2006 |
| WO | 20070066409 A1 | 6/2007 |
| WO | 20090017758 A2 | 2/2009 |
| WO | 20090017835 A2 | 2/2009 |
| WO | 20090023462 A1 | 2/2009 |

OTHER PUBLICATIONS

International Search Report and Written Opinion, PCT/US08/09207, dated Jan. 16, 2009.
International Search Report, PCT/US2007/021552, dated May 29, 2008.

International Search Report from PCT/US2010/000777, dated Nov. 19, 2010.
Bang, U.S. Appl. No. 60/030,463, filed Sep. 6, 2002.
International Search Report and Written Opinion, PCT/US2009/003643, dated Aug. 28, 2009.
Partial International Search Report, PCT/US2008/002659.
International Search Report, PCT/US2008/002659, dated Oct. 17, 2008.
International Search Report, PCT/US07/26095, dated Jul. 7, 2008.
International Search Report and Written Opinion, PCT/US2008/009356, dated Feb. 19, 2009.
International Search Report and Written Opinion, PCT/US2008/010746, date May 27, 2009.
Communication from PCT/US2010/000777, dated Aug. 5, 2010.
Office Action from U.S. Appl. No. 11/704,713 mailed Apr. 10, 2012.
Response to Office Action from U.S. Appl. No. 11/704,713 mailed Mar. 19, 2012.
Office Action from U.S. Appl. No. 12/908,227 mailed Apr. 19, 2012.
Response to Office Action from U.S. Appl. No. 12/908,227 mailed Mar. 20, 2012.
Japanese Office Action for JP2011-554055 dated Mar. 27, 2012.
Chinese Office Action for Application No. 200880109094.9 dated Jun. 30, 2011.
Chinese Office Action and Search Report for Application 200980122523 dated Aug. 20, 2012.
Japanese Office Action for Application No. 2010-519235 dated Nov. 13, 2012.

* cited by examiner

RECONSTITUTED WAFER STACK PACKAGING WITH AFTER-APPLIED PAD EXTENSIONS

CROSS-REFERENCE TO RELATED APPLICATION

This application claims the benefit of U.S. Provisional Application No. 60/962,200 filed Jul. 27, 2007, the disclosure of which is incorporated herein by reference.

BACKGROUND ART

The subject matter of the present application relates to microelectronic packages, or assemblies, comprised of stacked microelectronic elements and to methods of fabricating them, for example, by processing applied simultaneously to a plurality of microelectronic elements arranged in an array.

Microelectronic elements, such as semiconductor chips, are flat bodies with contacts disposed on the front surface that are connected to the internal electrical circuitry of the element itself. Microelectronic elements are typically packaged with substrates to form microelectronic packages, or assemblies, having terminals that are electrically connected to the element's contacts. The package or assembly may then be connected to test equipment to determine whether the packaged device conforms to a desired performance standard. Once tested, the package may be connected to a larger circuit, e.g., a circuit in an electronic product such as a computer or a cell phone.

Microelectronic packages or assemblies also include wafer level packages, which provide a package for a microelectronic component that is fabricated while the die are still in a wafer form. The wafer is subject to a number of additional process steps to form the package structure and the wafer is then diced to free the individual die. Wafer level processing may provide a cost savings advantage. Furthermore, the package footprint can be identical to the die size, resulting in very efficient utilization of area on a printed circuit board (PCB) to which the die will eventually be attached. As a result of these features, die packaged in this manner are commonly referred to as wafer-level chip scale packages (WLCSP).

In order to save space certain conventional designs have stacked multiple microelectronic chips or elements within a package or assembly. This allows the package to occupy a surface area on a substrate that is less than the total surface area of all the chips in the stack added together. Development efforts in this technology focus on producing wafer-level assemblies that are reliable, or thin, or testable, or which are economical to manufacture, or have a combination of such characteristics.

SUMMARY OF THE INVENTION

In accordance with an aspect of the invention, a method is provided for fabricating a stacked microelectronic assembly. The method can include providing a plurality of subassemblies, each being a reconstituted wafer or portion of a reconstituted wafer. Each reconstituted wafer or wafer portion has a front side and a rear side remote from the front side and may include a plurality of spaced apart microelectronic elements each having a front face exposed at the front side, contacts exposed at the front side, a rear face adjacent to the rear side, and edges extending between the front and rear faces. Each reconstituted wafer may further include a fill layer overlying the rear faces of the microelectronic elements and extending between the edges of adjacent microelectronic elements.

A plurality of traces may then be formed at the front side of each subassembly. The traces may extend from the contacts to beyond the edges of the microelectronic elements. A thickness of a first one of the microelectronic elements may then be reduced, e.g., by processing applied from the rear side, to reduce a thickness of the microelectronic elements therein. Thereafter, a second one of the subassemblies can be joined with the first subassembly such that the front side of the second subassembly confronts the rear side of the first subassembly and such that the front faces of microelectronic elements of the second subassembly may face toward the rear faces of the microelectronic elements of the first subassembly. Leads may be formed in at least one opening extending downwardly from the rear side of the second subassembly, the leads connected to the traces of the microelectronic elements of the first and second subassemblies.

In accordance with such aspect of the invention, prior to forming the leads, one or more additional subassemblies can be joined with the first and second subassemblies, such that the front faces of microelectronic elements in each such additional subassembly face toward the rear faces of microelectronic elements in each subassembly underlying the additional subassembly.

In accordance with another aspect of the invention, a method is provided for fabricating a stacked microelectronic assembly. In accordance with such aspect, a plurality of subassemblies can be provided, each being a reconstituted wafer or portion of a reconstituted wafer. Each such reconstituted wafer or wafer portion may have a front side and a rear side remote from the front side, and a plurality of spaced apart microelectronic elements having front faces exposed at the front side, contacts exposed at the front side, rear faces adjacent to the rear side, and edges extending between the front and rear faces. Each such reconstituted wafer may further include a plurality of traces extending from the contacts to beyond the edges of the microelectronic elements and a fill layer overlying the rear faces of the microelectronic elements and extending between the edges of adjacent microelectronic elements.

A first one of the subassemblies may then be reduced in thickness by processing applied to the rear side so as to reduce a thickness of the microelectronic elements therein. A second one of the subassemblies may then be joined with the first subassembly such that the front side of the second subassembly confronts the rear side of the first subassembly and the front faces of the microelectronic elements of the second subassembly overlie and face toward the rear faces of the microelectronic elements of the first subassembly.

Leads may then be formed in at least one opening extending downwardly from the rear side of the second subassembly which conductively connect to the traces of the microelectronic elements of the first and second subassemblies.

In accordance with another aspect of the invention, a method is provided for fabricating a stacked microelectronic unit. In accordance with such method, a plurality of microelectronic elements may be stacked and joined together, each of the microelectronic elements having a front face, a rear face remote from the front face, contacts exposed at the front face, edges extending between the front and rear faces and traces connected to the contacts, the traces extending along the front faces towards the edges. The microelectronic elements can be stacked such that front faces of at least some of the microelectronic elements overlie and confront the rear faces of other microelectronic elements. A plurality of conductors may then be formed which extend along the edges of the microelectronic elements from the traces to unit contacts overlying and adjacent to rear faces of microelectronic elements of the at least some of the microelectronic elements in the stacked microelectronic unit.

In accordance with one aspect of the invention, the unit contacts may overlie the rear faces of the microelectronic elements of uppermost microelectronic elements in the stacked microelectronic unit.

A stacked microelectronic unit may be provided in accordance with one aspect of the invention, the stacked unit having a top face, unit contacts exposed at the top face and a bottom face remote from the top face. In accordance with such aspect of the invention, the stacked unit may include a plurality of vertically stacked microelectronic elements each having a front surface, contacts exposed at the front surface, a rear surface and edges extending between the front and rear surfaces. Traces connected with the contacts may extend along the front surfaces towards the edges of the microelectronic elements, with the rear surface of at least one of the stacked microelectronic elements being adjacent to the top face of the microelectronic unit. A plurality of conductors may extend along the edges of the microelectronic elements from the traces to the top face. The conductors may be conductively connected with the unit contacts such that the unit contacts overlie the rear surface of the at least one microelectronic element adjacent to the top face of the stacked microelectronic unit.

In accordance with one of more aspects of the invention, some of the unit contacts may be exposed at the bottom face of the stacked microelectronic unit. One or more of the unit contacts may be connected to contacts on a front surface of at least one microelectronic element, such front surface being adjacent to the bottom face.

In accordance with an aspect of the invention, a stacked microelectronic unit is provided which can include first and second vertically stacked microelectronic elements. Each of the stacked microelectronic elements can have a front surface defining a lateral direction, at least one edge extending away from the front surface, contacts exposed at the front surface, and traces extending in the lateral direction from the contacts toward the edges, wherein the front surface of the second microelectronic element at least partially overlies the front surface of the first microelectronic element and the second microelectronic element has at least one edge displaced in the lateral direction from an adjacent edge of the first microelectronic element. A dielectric layer may overlie the laterally displaced edges of the microelectronic elements, the dielectric layer defining an edge of the stacked unit. Leads may be connected to traces at front faces of the microelectronic elements, the leads extending along the edges of the microelectronic elements to unit contacts.

In accordance with a more particular aspect of the invention, a stacked microelectronic unit may be provided in which the laterally displaced edges are first edges, and the edges of the microelectronic elements include second edges which extend in a second direction transverse to a first direction in which the first edges extend. Each of the first and second microelectronic elements may have at least one second edge which is displaced from an adjacent second edge of the other of the first and second microelectronic elements. The dielectric layer may overlie the second edges of the microelectronic elements, and second leads may overlie the dielectric layer and extend along the second edges of the microelectronic elements to unit contacts.

In accordance with one aspect of the invention, a stacked microelectronic unit is provided. In such microelectronic unit, first and second vertically stacked microelectronic elements can be provided wherein at least one first edge of the first microelectronic element at a first level extends beyond a corresponding first edge of a second microelectronic element at a second level overlying the first level. A dielectric layer may overlie the first edges of the first and second microelectronic elements, the dielectric layer defining a first edge of the stacked unit.

In accordance with a particular aspect of the invention conductive vias can extend through the dielectric layer, the vias being connected to traces at front faces of the microelectronic elements.

In accordance with another aspect of the invention, a stacked microelectronic unit is provided in which first and second microelectronic elements are vertically stacked such that the front face of the first microelectronic element overlies at least one of a front face or a rear face of the second microelectronic element. At least one of a width or a length of the front faces of the first and second microelectronic elements may differ. A dielectric layer may overlie the first edges of the first and second microelectronic elements. Leads may be connected to traces at front faces of the microelectronic elements. The leads may overlie the dielectric layer and the leads may extend along a first edge of the stacked unit.

DETAILED DESCRIPTION

Figure 1A:
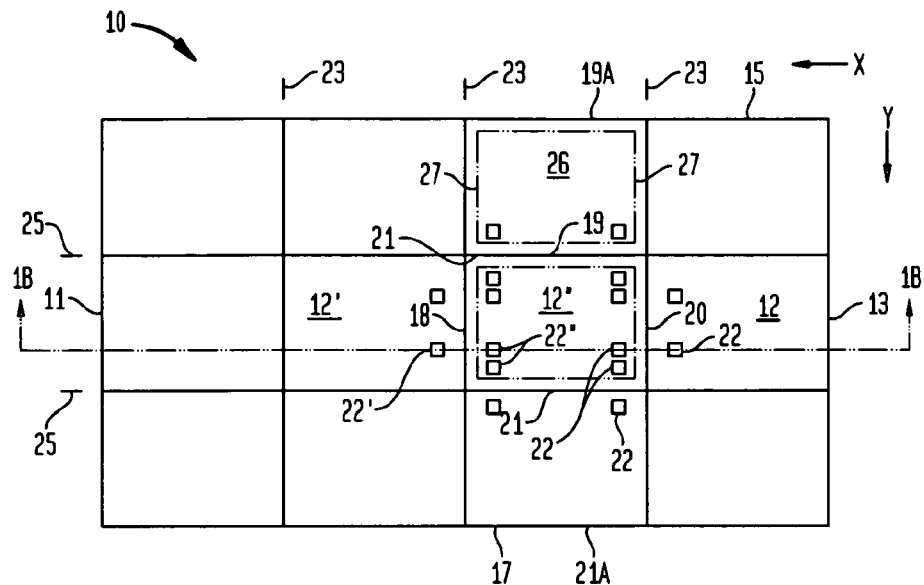
FIG. 1A is a plan view illustrating a wafer or portion of a wafer including a plurality of microelectronic elements attached at peripheral edges, in accordance with a stage in a method of fabricating a stacked microelectronic unit according to an embodiment of the invention.
Figure 1B:
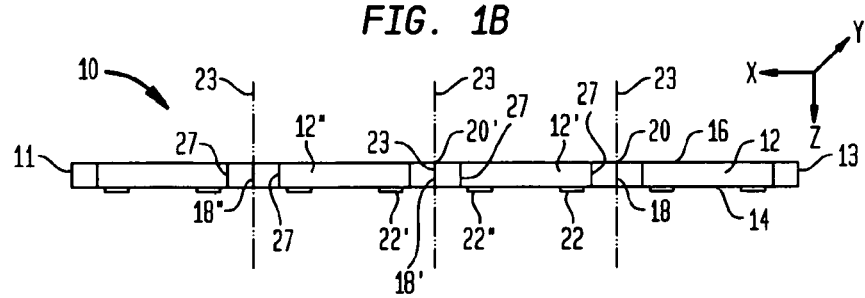
FIG. 1B is a sectional view of the wafer or portion of wafer through line 1B-1B of FIG. 1A.

FIGS. 1A-C illustrate an array, or a portion of an array of microelectronic elements, such as may be provided on a semiconductor wafer. FIG. 1A is a top plan view of a wafer 10 or portion of a wafer and includes a plurality of microelectronic elements 12, 12' (twelve prime), 12" (twelve double prime), each microelectronic element being shown as a rectangle. As seen in FIG. 1A, each microelectronic element is positioned side by side and adjacent to one another. The wafer can be in the shape of a circular wafer. Hereinafter, for ease of reference, the wafer 10 or wafer portion is referred to as "wafer". The wafer 10 may include numerous rows of microelectronic elements 12 aligned along an X-axis and a Y-axis. The wafer may include any number of microelectronic elements, including as little as tow or as many as is desirable. The microelectronic elements are formed integral with one another using semiconductor fabrication techniques. Each of the microelectronic elements of the wafer is typically of the same type. The microelectronic elements can have memory function, logic or processor function or a combination of logic and processor functions, among other possible types. In a particular example, each of the microelectronic elements includes a flash memory. For example, each microelectronic element can be a dedicated flash memory chip.

Wafer 10 in FIG. 1A has a top edge 15, a right edge 13, a left edge 11 and a bottom edge 17. FIG. 1C is an elevated side view of wafer 10 taken along line 1B (FIG. 1A), showing left edge 11 and right edge 13 of wafer 10. FIG. 1C also shows that each microelectronic element of wafer 10 also has a front face 14 and an oppositely-facing rear face 16. Note that in FIG. 1C, the front face 14 of wafer 10 has been turned over such that it faces downward in the figure.

In FIG. 1A, three microelectronic elements 12, 12", and 12' are individually called out in the middle row of the wafer 10. With reference to microelectronic element 12 of FIG. 1A, each microelectronic element has a first edge 18, a second edge 20, a third edge 19 and a fourth edge 21. When microelectronic element 12 is still part of the array of wafer 10, a first edge 18 of one microelectronic element 12 abuts (or is attached to) second edge 20 of a second and adjacent microelectronic element 12. Similarly, a third edge 19 (FIG. 1A) of one microelectronic element 12 is attached to a fourth edge 21 of an adjacent microelectronic element. Thus, a microelectronic element 12" positioned in a middle row of the wafer portion 10 is bordered by an adjacent microelectronic element at all four edges, as shown in FIG. 1A. When microelectronic element 12 is entirely separated from wafer 10 (e.g., singulated therefrom), it can be seen that each of first edge 18, second edge 20, third edge 19 and fourth edge 21 extends from the front face 14 (FIG. 1C) to the rear face 16 (FIG. 1C) of the microelectronic element 12.

Portions of wafer 10 where adjacent microelectronic elements contact one another form saw lanes or strips 23 and 25 where the wafer can be cut without damaging the individual microelectronic elements. For instance, as shown in FIG. 1B, second edge 20' of microelectronic element 12' abuts first edge 18' of microelectronic element 12" and forms a saw lane 23. Similarly, throughout the wafer 10, saw lanes 23 (shown in FIGS. 1A and 1C) are located at positions where microelectronic elements 12 abut one another.

With reference to microelectronic element 12" of FIG. 1B, each microelectronic element includes a plurality of contacts 22" exposed at the respective front face 14 of the microelectronic element 12. The contacts 22 can be, for example, bond pads or lands of the microelectronic elements as originally formed in a wafer fabrication facility. Each microelectronic element of the uncut wafer 10 has a device region 26 (area within dashed lines 27) in which active semiconductor devices and typically also passive devices are disposed. Each microelectronic element also includes a non-device region disposed beyond edges of the device region 26 where no active semiconductor devices or passive devices are disposed. Note that the bounded area of device region 26 is shown by solid lines in FIG. 1C.

In one stacked assembly fabrication embodiment, an assembly including a plurality of stacked microelectronic elements is fabricated by simultaneously processing a plurality of microelectronic elements en masse. Moreover, processing can be carried out simultaneously as to microelectronic elements which are arranged in form of an array, similar to the processing of an original wafer containing such microelectronic elements. FIGS. 2A-10A illustrate stages in a method of forming a package or assembly of stacked microelectronic elements in accordance with a first fabrication embodiment. In this embodiment, original, wafer 10 is first separated into individual microelectronic elements and then selected ones of the individual microelectronic elements are attached in form of an array to a carrier layer for further processing. In this embodiment, the array of selected microelectronic elements can be considered a "reconstituted wafer" which is then available for processing according to wafer-level processing techniques.

FIG. 2 illustrates a stage of fabrication in which an original wafer 10 is separated into individual microelectronic elements 12 by severing, e.g., sawing or scribing wafer 10 along the dicing lanes 23 and 25 (FIG. 1A).

Figure 2A:
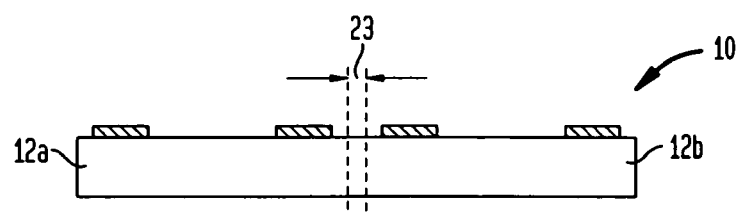
FIGS. 2A, 2B, 3, 4, 5, 6, 7 and 8A are sectional views illustrating stages in a method of fabricating a stacked microelectronic unit according to an embodiment of the invention.
Figure 2B:
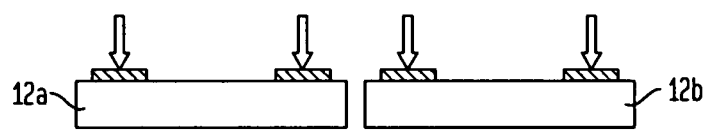

FIG. 2A illustrates a stage of fabrication in which the wafer 10 is separated into individual microelectronic elements 12 by severing, e.g., sawing or scribing the wafer 10 along the dicing lanes 23 and along dicing lanes 25 (FIG. 1A). From the individual microelectronic elements obtained during this stage (FIG. 2B), selected ones 12 of the microelectronic elements, i.e., known good die, are attached at their front faces to an adhesive carrier 160 (FIG. 3) or other carrier having an adhesive interface (not shown). FIG. 2B represents determination of a known good die 12a and a rejected die 12b, the rejected die being removed from further processing.

Figure 3:
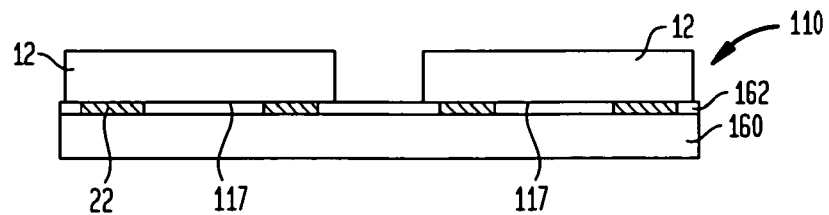
Figure 4:
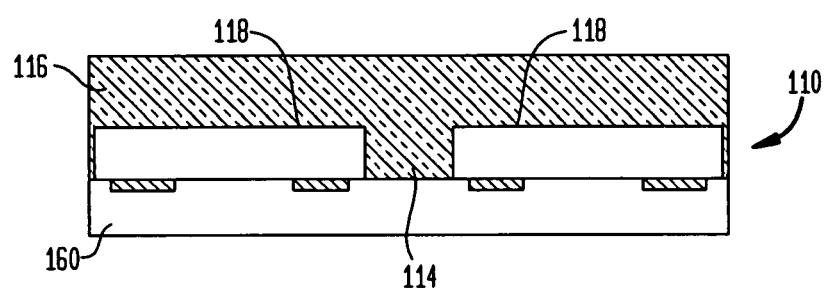

A pick-and-place tool can be used, for example, to place each microelectronic element 12 at the proper position on the carrier 160 to form a layer of microelectronic elements which make up a first reconstituted wafer 110 as shown in sectional view in FIG. 3. As seen therein, the reconstituted wafer 110 includes individual microelectronic elements 12 that were selected from the microelectronic elements 12 obtained during the dicing (sawing) stage of FIG. 2. Individual microelectronic elements 12 are referred to as the known good die, and are attached to a carrier 160 using an adhesive 162, with the front face of each die and contacts 22 thereon facing the carrier 160. A pick-and-place tool can be used to place each microelectronic element at the proper position on the carrier 160 to form reconstituted wafer structure 90.

An advantage of processing a reconstituted wafer rather than the original wafer 10 is that the microelectronic elements that make up each reconstituted wafer can be individually selected. When some of the microelectronic elements of the original wafer are of known or suspected marginal or failing quality, they need not be processed into reconstituted wafers. Rather, those microelectronic elements can be left out of the reconstituted wafer such that the reconstituted wafer contains better quality microelectronic elements. Selection of the microelectronic elements to go into the reconstituted wafer can be based on various criteria of quality or expected quality based on results of visual, mechanical or electrical inspection or location of the microelectronic element within the original wafer 10, for example. In a particular embodiment, microelectronic elements may in fact be tested electrically before placing each one into position on the reconstituted wafer. Whether the microelectronic elements are selected based on visual, mechanical or electrical criteria or other criteria, the microelectronic elements which are selected for inclusion in the reconstituted wafer can be referred to as "known good" microelectronic elements or "known good die".

After attaching the microelectronic elements 12 to the carrier 160, a fill layer 116 (FIG. 4) is formed which fills spaces 114 of the reconstituted wafer 110 between adjacent microelectronic elements. The fill layer may also cover rear faces 118 of the microelectronic elements 112. The fill layer can include a variety of materials. The fill layer may include a dielectric material for providing isolation between the microelectronic elements and conductors which may be connected thereto, such as described in the following. For example, the fill layer may include one or more inorganic dielectric materials such as an oxide, nitride, which may include silicon dioxide, silicon nitride or other dielectric compound of silicon such as SiCOH, among others, or may include an organic dielectric, among which are various polymers such as epoxies, polyimide, thermoplastics, thermoset plastics, among others. The fill layer may be an encapsulant such as commonly used to form an overmold overlying the rear face and edges of an overmold packaged chip.

The carrier 160 then can be removed to expose front faces 117 of the microelectronic elements and the contacts 22 including contact 22' and 22" of microelectronic elements 12' and 12", respectively. Thereafter, traces 24 are formed which extend outwardly from each of the contacts 22 beyond at least some of the edges 18', 20', 18" and 20" (FIG. 5) of the microelectronic elements and optionally beyond edges 19 and 21 (FIG. 1A) of individual microelectronic elements 12. Traces 24' and 24" of adjacent microelectronic elements 12' and 12" may meet at a location between the edges 20' and 18" of the adjacent microelectronic elements. Traces 24', 24" (FIG. 5) may actually form a single trace extending between contact 22' and contact 22". However, it is not required that the traces actually contact one another.

The resulting reconstituted wafer 130 (FIG. 5) includes the reconstituted wafer 110 with the microelectronic elements 12', 12" having the overmold or other fill layer 116 covering the rear faces 118 and space 114. Traces 24, 24', 24" and 24'" extend from the contacts 22 (including contacts 22', 22", etc.) along the front faces 117 of the microelectronic elements. Front faces 117 of the microelectronic elements 12 are adjacent to a front side 132 of the reconstituted wafer. The rear faces 118 of the microelectronic elements are disposed remote from the front side 312 and are adjacent to the rear side 134 of reconstituted wafer 130.

Figure 6:
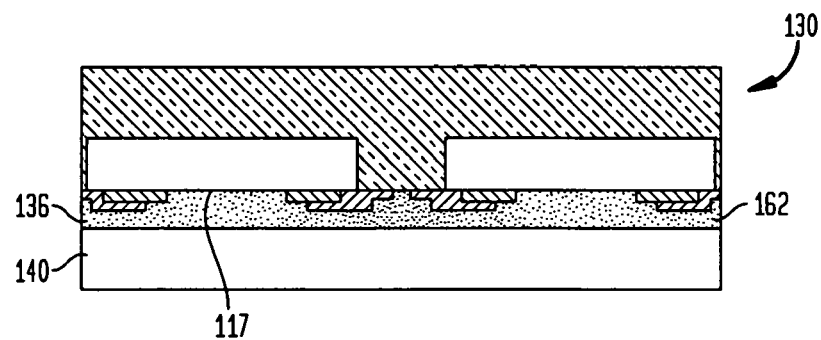

A plurality of reconstituted wafers 130 can be prepared according to the foregoing described processes, before conducting further processing as described below to form stacked microelectronic units. In such further processing, each reconstituted wafer 130 can be referred to as a "subassembly" because such subassemblies can be fabricated individually and then assembled and processed to form a stacked microelectronic unit, as will be described below. FIG. 6 illustrates a stage of fabrication in which the front side 132 of a first subassembly 130 is joined with a packaging layer 140, e.g., a bottom dielectric substrate which may include organic or inorganic materials or a combination thereof. An adhesive layer 162 can be used to join the subassembly 130 with the packaging layer 140.

Figure 7:
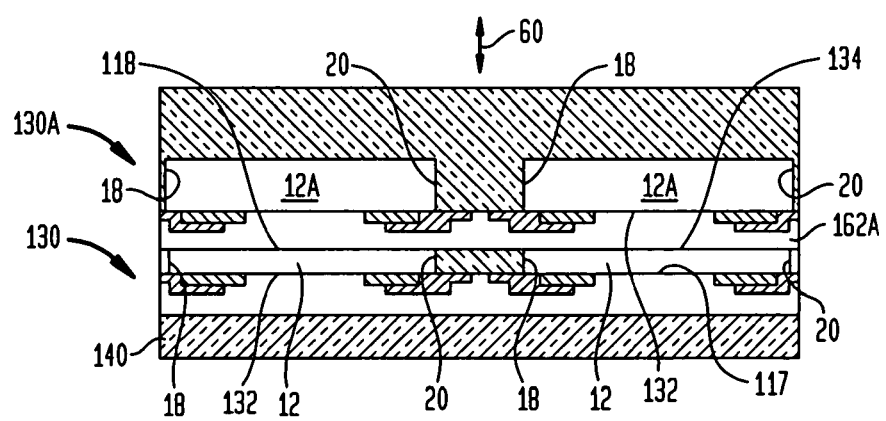
Figure 8A:
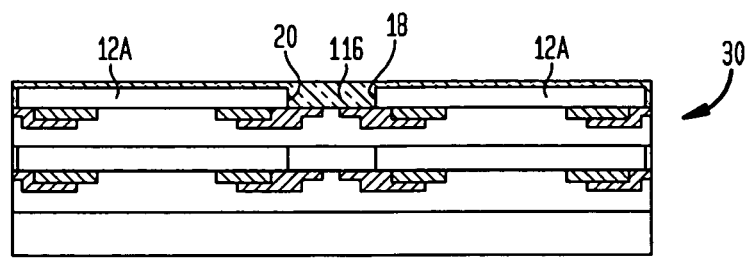
Figure 8B:
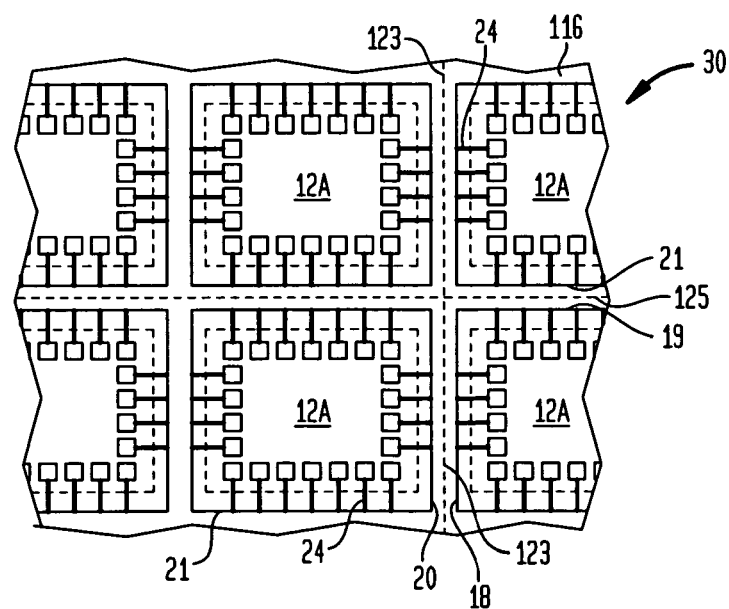
FIG. 8B is a fragmentary partial plan view of a stacked assembly in accordance with the stage of fabrication corresponding to the sectional view of FIG. 8A.

Subsequently, the thickness of the first subassembly 130 (FIG. 7) and the microelectronic elements 12 therein can be reduced by grinding, lapping or polishing such subassembly from its rear side 134 so as to reduce the thickness of each microelectronic element 12 therein. A second subassembly 130A similar to the first subassembly can then be bonded to the first subassembly using an adhesive layer 162A, such that the front side 132 of the second subassembly confronts the rear side 134 of the first subassembly, as shown in FIG. 7. The microelectronic elements 12A of the second subassembly are stacked in registration with corresponding microelectronic elements 12 of the first subassembly, such that at least a portion of the microelectronic elements 12A of the second subassembly directly overlie the rear faces 118 of microelectronic elements 12 of the first subassembly. In one embodiment as illustrated in FIGS. 8A-B, edges 18 of the microelectronic elements 12A of the second subassembly 130A are aligned in a vertical direction 60 (a direction transverse to the front faces 117 of microelectronic elements 12) with corresponding edges 18 of the microelectronic elements 12 of the first subassembly 130. In addition, edges 20 of the microelectronic elements 12A of the second subassembly 130A can be aligned in the vertical direction 60 with corresponding edges 20 of the microelectronic elements 12 of the first subassembly. In like manner, the edges 19 and 21 (FIG. 1A) of microelectronic elements 12A of the second subassembly 130A can be aligned in the vertical direction with respective edges 19 and 21 of the corresponding microelectronic elements 12 of the first subassembly 130.

Thereafter, the thickness of the second subassembly is reduced, such as by grinding, lapping or polishing, that the microelectronic elements 12A thereof have reduced thickness, as illustrated in FIG. 8A. As a result, the dielectric material of the fill layer 116 which directly overlies each microelectronic element 12A can be removed such that the fill layer only remains between the confronting edges 18 and 20 and between confronting edges 19 and 21 of adjacent microelectronic elements 12A of the second subassembly, as best seen in the fragmentary partial plan view of FIG. 8B. As also depicted in FIG. 8B, the edges of the microelectronic elements 12A of the second subassembly and the edges of microelectronic elements 12 of the underlying first subassembly are aligned so as to define streets 123 and 125 of a stacked assembly 30 with the fill layer 116 disposed in the streets. As also seen in FIG. 8B, the traces 22 extend outward beyond the edges 18, 19, 20, 21 of each chip into the streets 123, 125 between the microelectronic elements.

Figure 9:
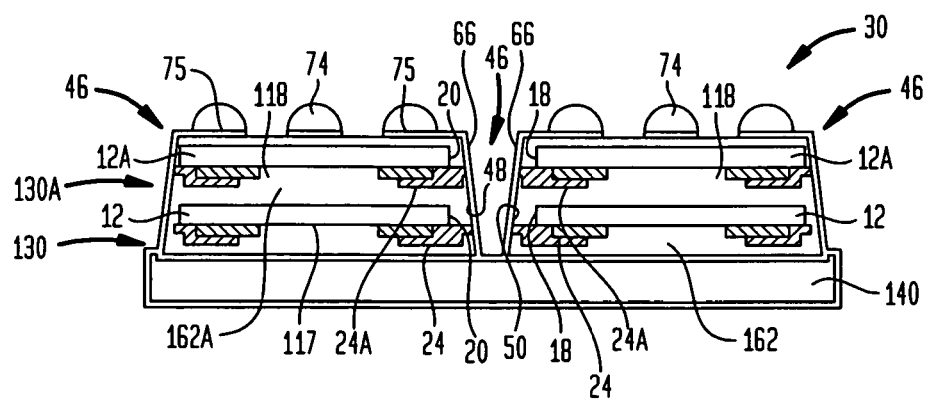
FIGS. 9 and 10A are sectional views illustrating stages subsequent to the stage illustrated in FIGS. 8A-B, in a method of fabricating a stacked microelectronic unit according to an embodiment of the invention.

Subsequently, a plurality of channels 46 are cut into the stacked assembly 30 in alignment with the streets, as illustrated in FIG. 9. The channels 46 can be formed using a mechanical cutting instrument not shown in the figures. Examples of such a mechanical cutting instrument can be found in U.S. Pat. Nos. 6,646,289 and 6,972,480, the disclosures of which are hereby incorporated by reference herein. Alternatively, a laser drilling technique can be used to form the channels. Channels 46 can be formed in the stacked assembly 30 at locations that are between first edges 18 of microelectronic elements 12, 12A in the stacked assembly 30 and adjacent second edges 20 of other microelectronic elements 12, 12A in the stacked assembly. Channels may also be formed at locations between third edges (FIG. 8B) of microelectronic elements and fourth edges 21 (FIG. 8B) of microelectronic elements 12, 12A adjacent thereto. The channels 46 extend downwardly within the streets adjacent to edges of microelectronic elements 12, 12A of respective subassemblies 130, 130A.

As illustrated in FIG. 9, the channels 46 may be formed such that they do not extend entirely through the stacked assembly 30. For example, as shown in FIG. 9, the microelectronic elements 12 of the first subassembly 130 remain attached to each other because the channels 46 do not extend through the carrier layer 140 underlying the first subassembly 130. However, the channels 46 do extend far enough so as to contact the traces 24 of the first subassembly 130. Similarly, the channels 46 extend through adhesive layer 162A connecting the first and second subassemblies 130, 130A. Optionally, the channels may extend through the lower adhesive layer 162 which connects the first subassembly to the carrier layer 140. Although the channels 46 are illustrated having inclined walls 48, 50, optionally, the walls may be straight, that is, parallel to each other and oriented in a normal direction to the plane defined by the front faces 117 of the microelectronic elements 12.

Once the channels 46 have been created in the stacked assembly 30, leads 66 (FIG. 9) may be formed on the walls 48, 50 of channels 46. The leads 66 may be formed by any suitable metal deposition technique, for example, a process that includes sputtering or electroless plating, photolithography and electroplating or any combination thereof. A three-dimensional photolithography process may be employed to define locations of the leads, such as is disclosed in commonly owned U.S. Pat. No. 5,716,759, the disclosure of which is hereby incorporated by reference herein. The leads 66 extend along walls of the channels 46 and electrically contact the traces 24 of the microelectronic elements 12, 12A of each respective subassembly 130, 130A.

In the embodiment illustrated in FIG. 9, the leads 66 extend beyond the walls 48, 50 of channels 46 such that the leads overlie the rear surfaces 118 of microelectronic elements 12A. The leads 66 may include ends 75 or pads remote from channels 46 on which solder bumps 74 may be disposed. Each lead 66 can electrically connect with both a trace 24 of a microelectronic element 12 and a trace 24A of microelectronic element 12A, as a result of those traces 24, 24A being aligned and exposed at a given wall, e.g. wall 48 of the channel 46.

Alternatively, each lead 66 can electrically connect with only one of the traces 24, 24A exposed at a wall of the channel, e.g., wall 48. Such result may be obtained by positioning the traces 24, 24A in different planes which occur at different positions into and out of the sheet relative to the particular section which is illustrated in FIG. 9. For example, the plane in which trace 24 is found as illustrated in FIG. 9 may be offset from the plane in which trace 24A is found such that trace 24 is closer to the reader when viewed in three dimensions. Lead 66, which is aligned and connected with trace 24, would then also be offset from trace 24A and not in contact with trace 24A. In such embodiment, each of the traces 24, 24A then would be attached to different leads 66 which would extend along a wall 48 or 50 and to positions overlying the rear surface 118 of the microelectronic elements 12A.

Figure 10A:
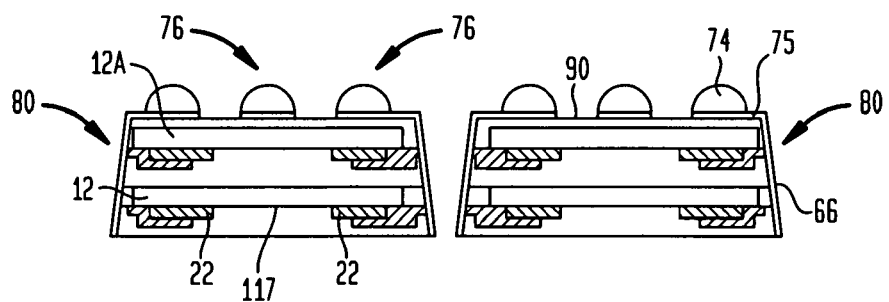

As shown in FIG. 10A, after the channels 46 and various conductive elements including leads 66 are formed in the stacked assembly 30, individual packages 80 may be severed from the stacked assembly 30 by separating the carrier layer 140 from the stacked assembly and cutting or breaking any material remaining between adjacent microelectronic elements of the stacked assembly. In this way, a plurality of stacked individual microelectronic units 80 result, with each stacked individual unit 80 containing a plurality of microelectronic elements stacked one upon another. Alternatively, the carrier layer 140 may remain in place and the carrier layer then is severed in alignment with the channels 46. In such case, a portion of the carrier layer then will be included in each resulting individual stacked unit 80.

As further seen in FIG. 10A, the ends 75 of the leads, with bumps 74 optionally disposed thereon, function as unit contacts 76 at a top face 90 of each microelectronic unit 80. In each stacked microelectronic unit 80, at least one or more of the microelectronic elements 12, 12A has a front face 117 and contacts 22 which face away from the top face 90 of the stacked unit.

Figure 10B:
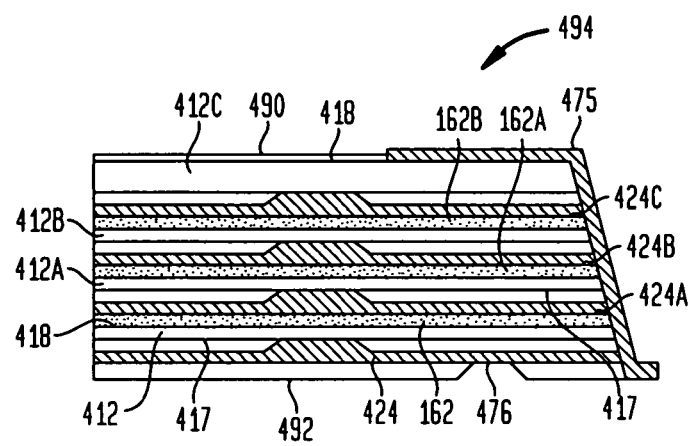
FIG. 10B is a sectional view illustrating a stacked microelectronic unit in accordance with a variation of the embodiment illustrated in FIG. 10A.

FIG. 10B is a fragmentary sectional view illustrating a portion of an individual stacked microelectronic unit 490 having four microelectronic elements 412, 412A, 412B and 412C stacked therein, the microelectronic elements being joined together through adhesive layers 162, 162A, and 162B. Greater or fewer numbers of vertically stacked microelectronic elements can be included in the package. The front face 417 of some of the microelectronic elements can face toward the rear faces of other microelectronic elements in the microelectronic unit 490. For example, in FIG. 10B, the front face 417 of microelectronic element 412A faces toward the rear face 418 of microelectronic element 412. The package is capable of being externally interconnected to other elements by ends 475 of leads functioning as top unit contacts overlying the top face 490 of the unit. The top unit contacts 475 are adjacent to the rear face 418 of microelectronic element 412C. Thus, the front faces of microelectronic elements 412, 412A, face away from the top face 490 of the stacked unit.

In addition, the package is capable of being externally interconnected by bottom unit contacts 476 exposed at a bottom face 492 of the microelectronic unit. Each bottom unit contact 476 may be conductively connected to only one trace 424 of one microelectronic element and have no connections to the traces on the other microelectronic elements in the microelectronic unit. Alternatively, each bottom unit contact 476 may be conductively connected to two, three or more of the traces 424, 424A, 424B, 424C which are aligned together within the plane in the section illustrated in FIG. 10B.

Figure 10C:
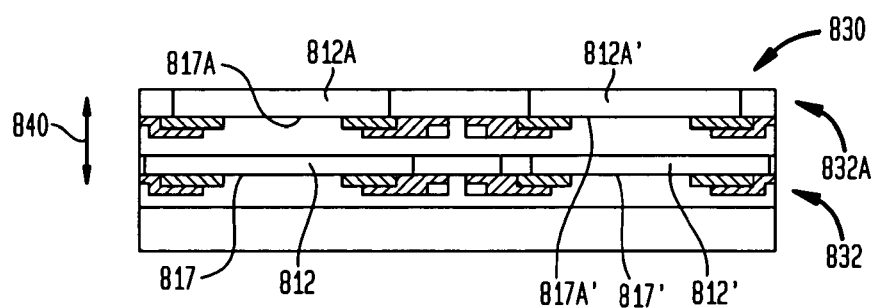
FIG. 10C is a sectional view of a stacked assembly in a stage of a method in accordance with an embodiment of the invention.
Figure 10D:
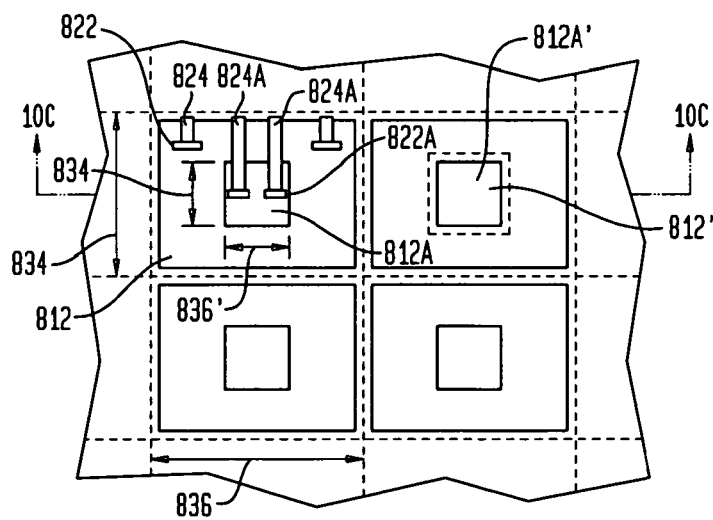
FIG. 10D is a fragmentary partial plan view corresponding to the sectional view of FIG. 10C, the sectional view in FIG. 10C being taken through line 10C-10C of FIG. 10D.

In a variation of the above-described process of forming stacked packages through the formation and joining of reconstituted wafers (FIG. 10C) microelectronic elements of differing sizes are joined together within a stacked assembly 830. FIG. 10C illustrates a stage of fabrication prior to that in which channels 46 (FIG. 9) are formed. FIG. 10D is a fragmentary partial plan view corresponding thereto, looking towards front faces of microelectronic elements 812A and microelectronic elements 812 which underlie and are aligned with the microelectronic elements 812A in a vertical direction 840 of the assembly. As illustrated in FIGS. 10C-10D, some of the microelectronic elements 812A which make up an upper subassembly 832A of the stacked assembly may have greater or smaller dimensions than microelectronic elements 812 of a lower subassembly 832 therein. Thus, in the example shown in FIG. 10D, both the length 834' and width 836' of the front face 817A of the upper microelectronic element 812A can be smaller than the length 834 and width 836 of the front face 817 of the lower microelectronic element 812 that it overlies. In another example, the length and width of front faces 817', 817A' of vertically aligned microelectronic elements 812' and 812A' of the stacked assembly are the same, but these dimensions are different from, i.e., smaller than the dimensions of other microelectronic elements in the stacked assembly 830.

Figure 5:
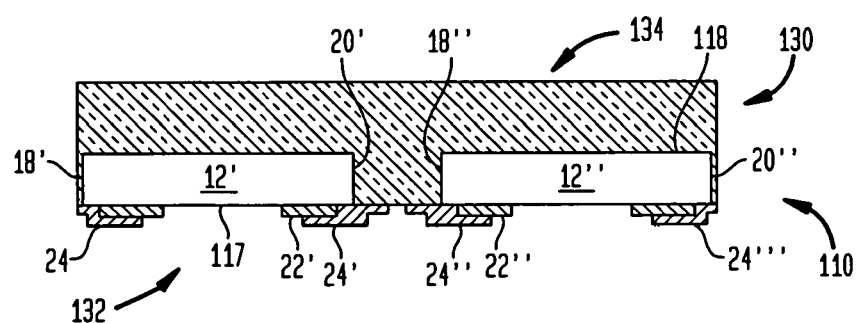

The versatility of the techniques described herein is exemplified by the structure shown in FIGS. 10C-10D. Specifically, traces 824 extending outward from contacts 822 on microelectronic elements 812 can have different lengths from the traces 824 which extend outward from the contacts 822A on microelectronic elements 812A, since the process of forming an overmold layer 116 (FIG. 4) leaves a surface on which traces of different lengths can be formed by subsequent processing (FIG. 5). Many variations can be made whereby, for example, microelectronic elements of an upper layer have larger size than those of the lower layer. In yet another example, smaller dimensioned chips can be vertically sandwiched between larger dimensioned chips, or larger dimensioned chips can be vertically sandwiched between smaller dimensioned chips.

Figure 11:
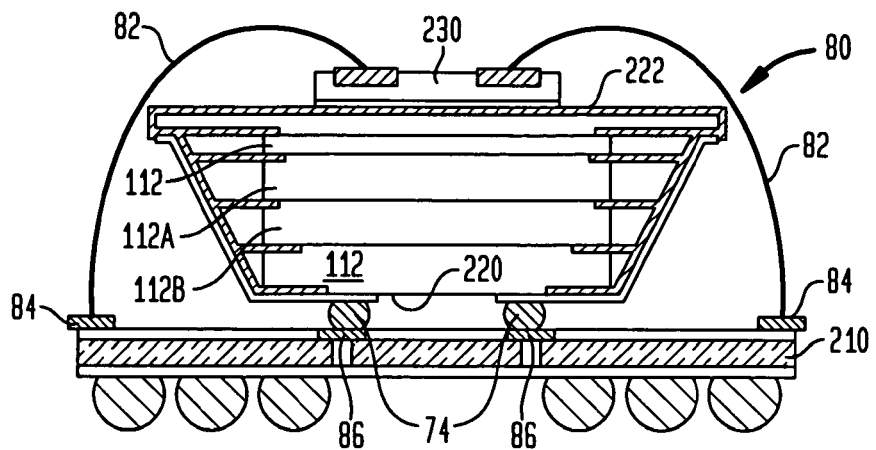
FIG. 11 is a sectional view of a stacked microelectronic unit and its external interconnection to other elements in accordance with an embodiment of the invention.

An individual stacked assembly 80, unit or package (FIG. 11) can be conductively connected using solder bumps at the front face 220 of the package 80 to an interconnection element 210, e.g., a dielectric element, substrate, circuit panel or other element having terminals 84, 86 and conductive wiring therein. One or more additional microelectronic elements 230 can be attached to a rear face 222 of the package 80 and electrically interconnected by bond wires 82 to the terminals 84 of the interconnection element. Such microelectronic element 230 can include one or more additional microelectronic elements which supplement the function of the stacked package 80, e.g., such as a microcontroller, or can include one or more redundancy elements for substitution with one or more microelectronic elements 112, 112A, 112B, or 112C, etc. of the assembly in case of a problem with such microelectronic element. In a particular embodiment, the individual stacked assembly or unit 80 may be incorporated into microprocessors, and RF units among other assemblies. One or more stacked units 80 may incorporate particular types of microelectronic elements such as flash memory or dynamic random access memory (DRAM) units and be incorporated in various units including memory modules, memory cards, and the like. Other exemplary arrangements for mounting and interconnecting the stacked unit 80 to an interconnection element are shown and described in commonly owned U.S. patent application Ser. No. 11/787,209 filed Apr. 13, 2007, the disclosure of which is hereby incorporated herein by reference. For example, the stacked unit 80 can be mounted with the front face facing either downwardly towards the interconnection element or upwardly away therefrom. In addition, the one or more additional microelectronic elements can be mounted either face-up as shown in FIG. 11 or face-down, such that the contact-bearing face is flip-chip mounted to the stacked unit 80. Various combinations and configurations and possible, such as illustrated in incorporated U.S. patent application Ser. No. 11/787,209.

Figure 12:
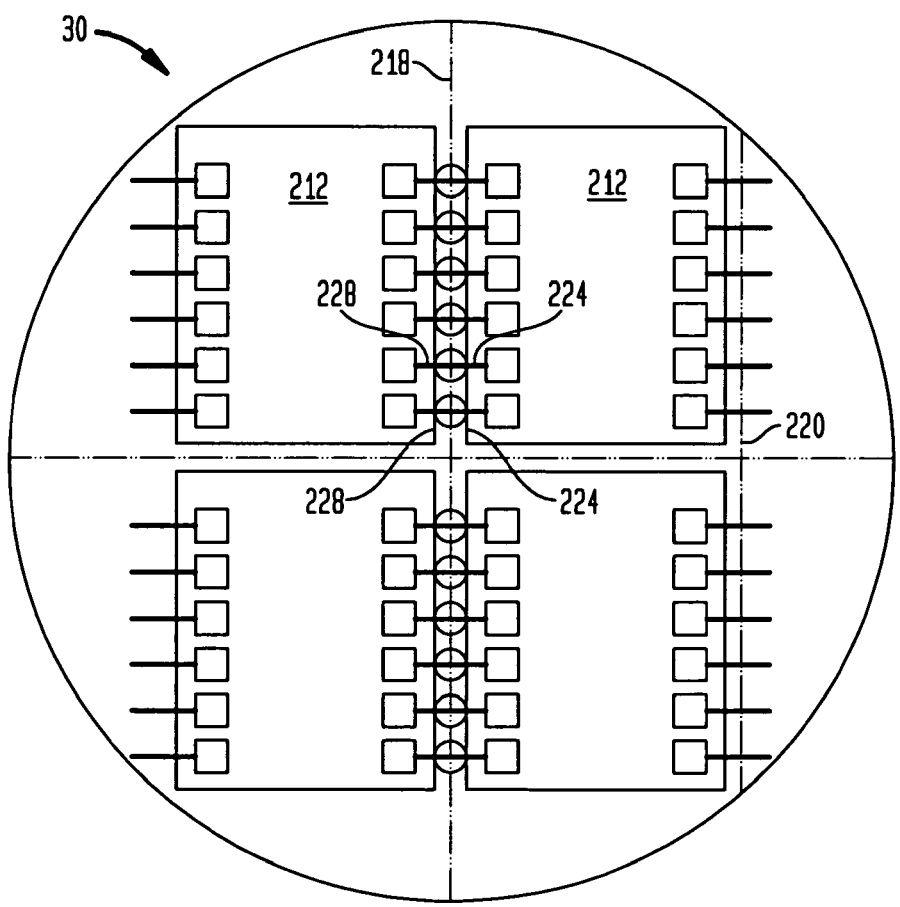
FIG. 12 is a fragmentary partial plan view of a stacked assembly in a stage of a method in accordance with a variation of the embodiment of invention shown in FIGS. 2A through 10A.
Figure 13A:
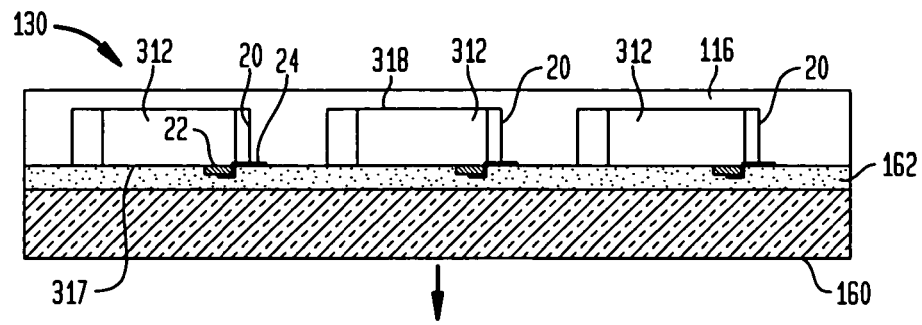
FIG. 13 contains sectional views illustrating a series of successive stages (A) through (D) in a method of fabricating a stacked microelectronic unit in accordance with an embodiment of the invention.
Figure 13B:
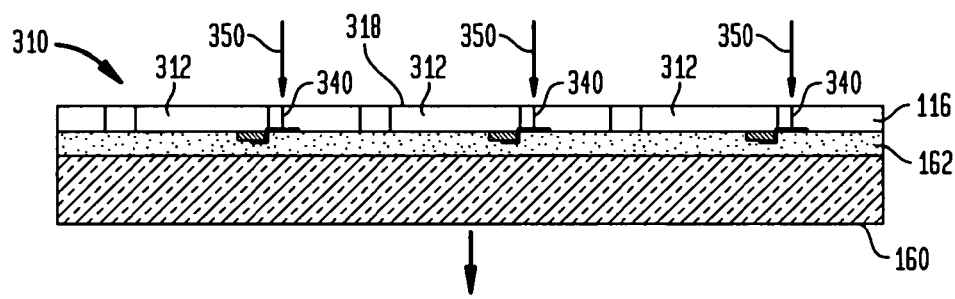
Figure 13C:
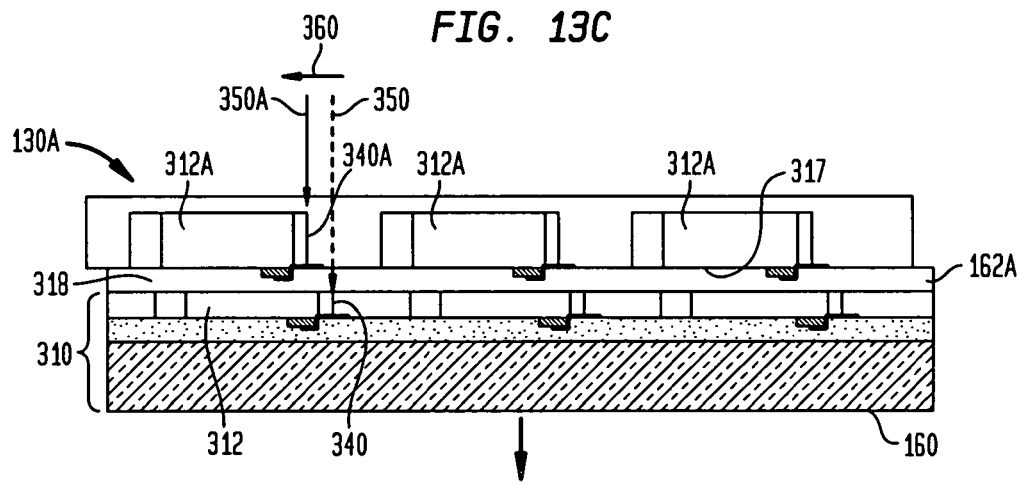
Figure 13D:
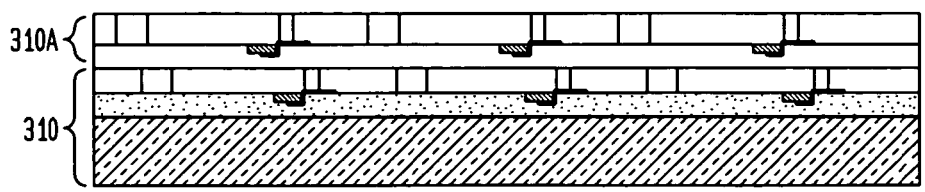
Figure 14:
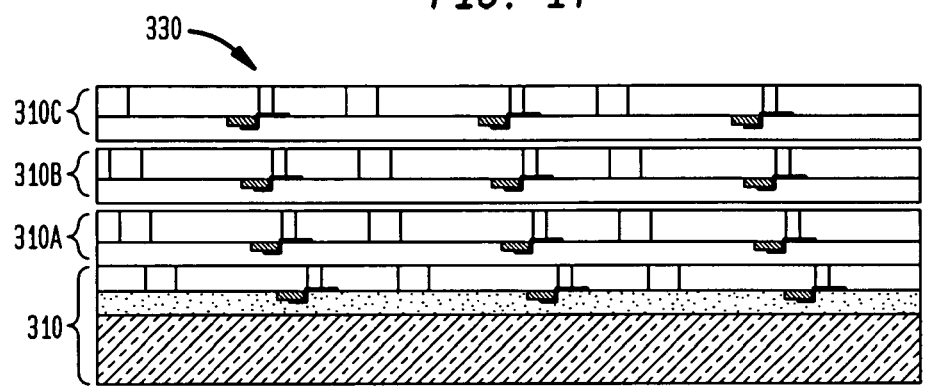
FIG. 14 is a sectional view illustrating a stacked assembly in a stage subsequent to stage (D) of FIG. 13 in a method of fabricating a stacked microelectronic unit in accordance with an embodiment of the invention.

FIG. 12 is a fragmentary partial plan view showing a variation of the above embodiment, wherein, after forming the stacked assembly 30 (FIG. 8), the step of forming channels which expose all of the traces 24, 24A of both the stacked microelectronic elements 12, 12A is omitted. Instead, a series of individual openings 228 are formed between the edges of respective microelectronic elements in alignment with the streets 218, 220. Unlike the channels (FIG. 9) formed in the above-described embodiment, each of the openings 228 exposes no more than a single trace 224 of each respective microelectronic element. As shown in FIG. 12, traces 224 connected to contacts of two adjacent microelectronic elements 212 are exposed within one of the openings 228 between two adjacent microelectronic elements. In the stacked assembly 30 as shown in FIG. 12, a plurality of traces 224 connected to microelectronic elements of the same subassembly can be exposed within a single opening 228. Alternatively or in addition thereto, a plurality of traces 224 connected to respective subassemblies 130, 130A (FIG. 7) of the stacked assembly. can be exposed within a single opening 228 However, openings 228 can be formed such that no more than one trace of each individual microelectronic element is exposed within each opening 228.

To form leads and external unit contacts connected to individual ones of the traces 224 all openings 228 in the stacked assembly can be simultaneously filled with a conductor to form conductive vias connected to single traces of each microelectronic element. For example, the openings can be filled with a metal to form conductive vias by depositing a primary metal, e.g., by sputtering or electroless deposition, and then electroplating the resulting structure. Some of the metal deposited by the electroplating step may form a layer overlying the rear faces of the microelectronic elements. Such metal layer can be removed from the rear faces of the microelectronic elements, leaving surfaces of individual conductive vias exposed within each opening 228. Alternatively, the metal layer overlying the rear faces of the microelectronic elements 212 can be patterned by photolithography into individual leads extending from the vias onto locations overlying the rear faces of microelectronic elements 212, similar to the leads 66 overlying the rear faces 118 of microelectronic elements 12A in FIG. 9. Conductive bumps, e.g., solder bumps are balls, may then be formed at ends of the leads, as shown and described above with reference to FIG. 9.

In a particular embodiment, a metal composite can be deposited through a stencil or by screen-printing to fill the openings 228 in the stacked assembly and form leads which overlie the rear faces. Subsequently, the stacked assembly can be heated to cure the metal composite. The openings can be filled at the same time by the same deposition process as that which forms the leads or the openings can be filled at a different time or different process than that which forms the leads. The metal composite can include, for example, a metal-filled paste such as an epoxy-solder composition, silver-filled paste, or other flowable composition having a dielectric, e.g., polymeric component loaded with metal particles. The process of forming the leads can be additive; the leads can be formed by printing the metal composite through a screen or stencil onto the stacked assembly.

FIGS. 13 through 16 illustrate a method of fabricating a stacked assembly containing a plurality of microelectronic elements in accordance with a variation of the above-described embodiment (FIGS. 2A through 10A). FIG. 13 contains a series of sectional views (A) through (D) illustrating successive stages in the fabrication method. In stage (A) of FIG. 13, a reconstituted wafer 130 such as shown and described above (FIG. 5) is bonded with an adhesive layer 162 to a carrier 160 to form a structure similar to that shown in FIG. 6. The reconstituted wafer is bonded with the front faces 317 of the microelectronic elements 312, the contacts 22 thereon and the traces 24 extending therefrom being adjacent to the carrier 160. The traces may be such as to extend beyond only one or only some of the edges, e.g., edge 20—of each microelectronic element.

Then, as illustrated in stage (B) the reconstituted wafer is thinned to produce reconstituted wafer 310 by reducing the thickness of each microelectronic element 312 and the dielectric layer 116 such as by lapping, grinding or polishing the reconstituted wafer 130 from the rear faces 318 of the microelectronic elements 312.

After thinning the reconstituted wafer 310 to the desired thickness, a second reconstituted wafer 130A then is bonded (by adhesive layer 162A) to the first reconstituted wafer 310 with the front faces 317 of the microelectronic elements 312A facing toward the rear faces 318 of microelectronic elements 312 of the first reconstituted wafer 310 (stage (C)). The second reconstituted wafer 310A is bonded to the first reconstituted wafer in such way that an edge 340A of a microelectronic element 312A of the second reconstituted wafer 130A occurs at position 350A which is offset in a lateral direction 360 from the edge 340 of the first reconstituted wafer 310. Thus, when referring to microelectronic elements 312A of the second reconstituted wafer as the overlying microelectronic elements and microelectronic elements 312 of the first reconstituted wafer 310 as the underlying microelectronic elements, each of the overlying microelectronic elements 312A has an area overlapping an area of the underlying microelectronic element 312 to which it is bonded. Each of the overlying microelectronic elements 312A has an edge 340A that is displaced in the lateral direction 360 from the edge 340 of the underlying microelectronic element 312. The lateral offset distance between edges of vertically adjacent overlapping microelectronic elements can range from a few microns to tens of microns or more, for example.

Figure 15:
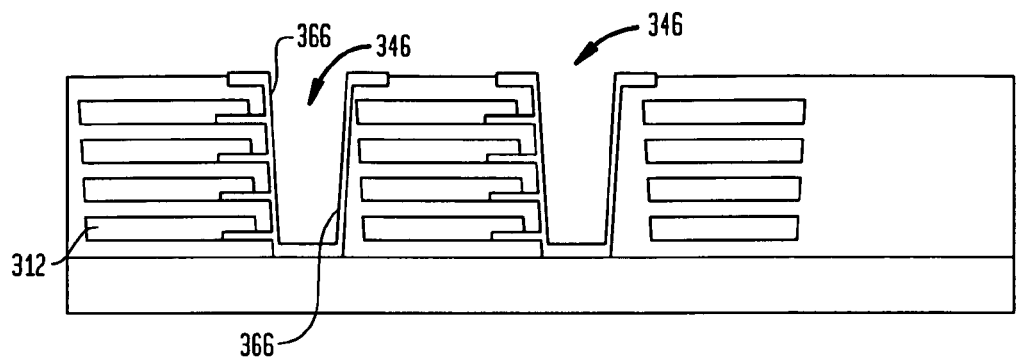
FIG. 15 is a sectional view illustrating a stacked assembly in a stage subsequent to the stage shown in FIG. 14 in a method of fabricating a stacked microelectronic unit in accordance with an embodiment of the invention.

With continued reference to FIG. 13, stage (D) shows the structure after thinning the second reconstituted wafer 130A in a manner such as described above (FIG. 13, stage (B)) to form reconstituted wafer 310A. The sub-processes shown with respect to stages (C) and (D) of FIG. 13 then are repeated for forming a third reconstituted wafer 310B containing microelectronic elements 312B and a fourth reconstituted wafer 310C containing microelectronic elements 312C to form the stacked assembly 330 shown in FIG. 14. As illustrated in FIG. 15, notches 346 are then cut between adjacent elements to expose the edges of the traces disposed on the front faces of the microelectronic elements in each reconstituted wafer 310, 310A, 310B and 310C.

An advantage of forming the stacked assembly in this manner is that process tolerances can improve for forming the leads 366. The lateral displacement of each overlapping microelectronic element in the stacked assembly relative to the microelectronic elements it overlies allows for slope in the sidewalls of each notch 346 formed therein. Increased lateral displacement allows the sidewalls of each notch 346 to be more heavily sloped, i.e., at a greater angle from the vertical. "Vertical" is defined herein as a normal angle to the plane defined by the contact-bearing surface of a microelectronic element, e.g., element 312. Despite greater slope of the wall, the notching operation, performed, e.g., by cutting or laser drilling exposes the edges of the traces even when the length of such traces is limited.

Figure 16:
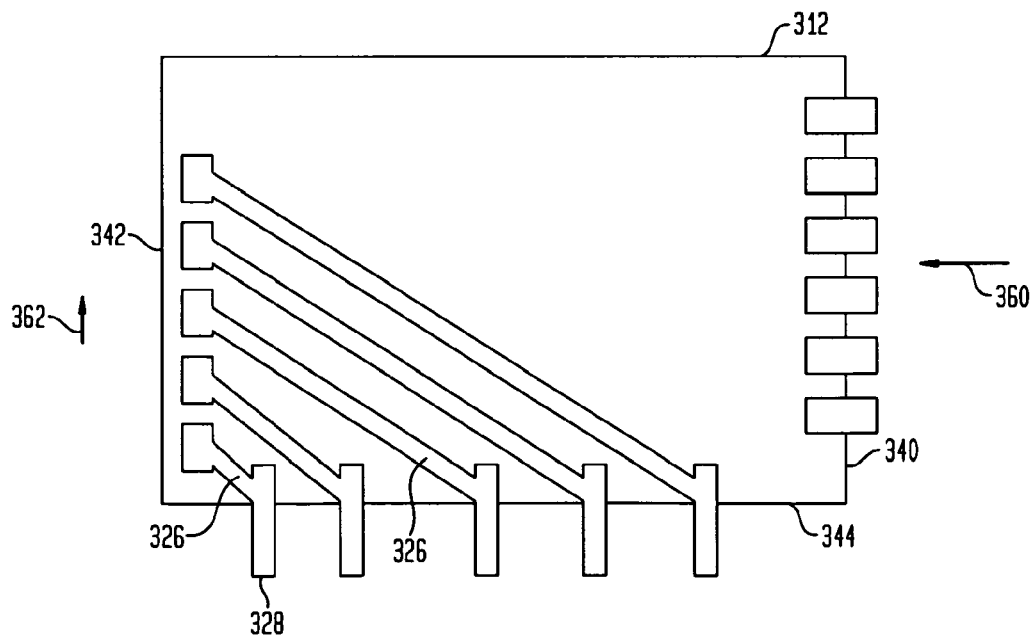
FIG. 16 is a sectional view illustrating a. microelectronic element contained within a stacked assembly in accordance with a variation of the embodiment of the invention illustrated in FIGS. 13 through 15.

FIG. 16 is a plan view illustrating a microelectronic element 312 of one reconstituted wafer 310 of a stacked assembly in a variation of the above-described embodiment (FIG. 15). When the microelectronic elements 312 are provided with contact pads adjacent to edges 340 and 342 as illustrated in FIG. 16, a redistribution layer including additional traces 326 can be provided which extends between the pads at edge 342 and outwardly beyond a third edge 344 of the microelectronic element 312. When forming the stacked assembly 330 (FIG. 14), the edges 344 of overlapping microelectronic elements of each successively stacked reconstituted wafer 310, 310A, 310B and 310C can also be offset from edges 344 of underlying microelectronic elements in a direction 362. In this way, leads can be formed in channels which expose traces 328 along the third edges 344 of the overlapping microelectronic elements, and process tolerance can also be improved for forming such leads.

Figure 17:
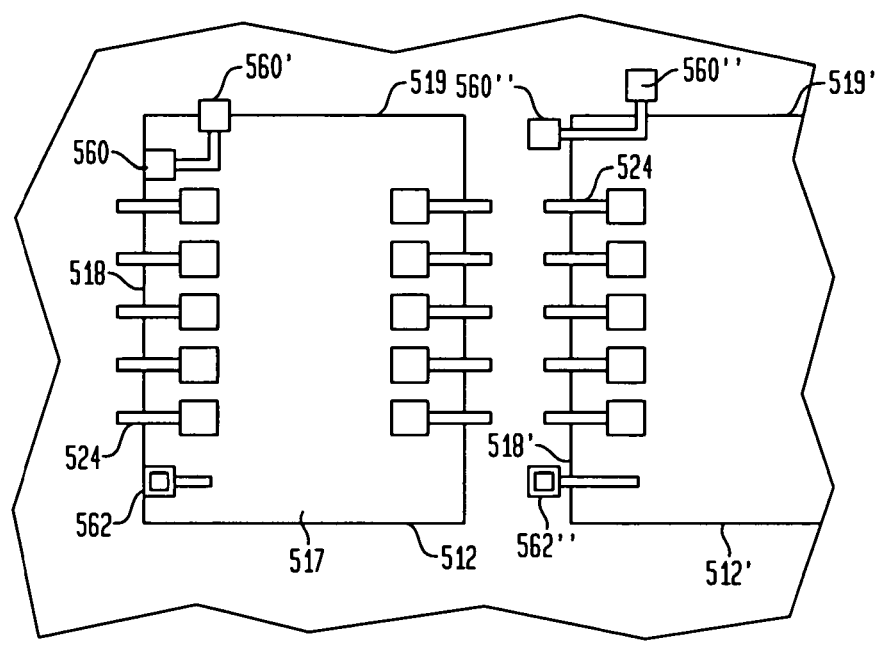
FIG. 17 is a fragmentary partial plan view illustrating a reconstituted wafer for fabrication into stacked microelectronic units in accordance with one or more of the embodiments of the invention.

In a particular variation of the above-described embodiments, alignment features 560, 562 (FIG. 17) can be formed on the front faces 517 each microelectronic element 512 of the reconstituted wafer at a stage of fabrication when the outwardly extending traces 524 are formed. The alignment features can be formed of metal simultaneously with the traces 524 by the same processing which forms the traces, such processing illustrated and described above with respect to FIG. 5. Alternatively, the alignment features can be formed by different processing from that which forms the traces. Stated another way, the alignment features can be formed using all the same processing steps as used to form the traces or by performing at least one processing step different from the processing steps used to form the redistribution traces.

When the alignment features are formed by different processing, they may include a material which is not included in the traces 524. Likewise, traces 524 may include a material, e.g., a metal which is not included in the alignment features. Optionally, the alignment features may be formed to include a material which is particularly reflective of a wavelength of a source, e.g., an infrared source used to illuminate the alignment features.

The alignment features may include two or more types of features, e.g., closed features 560 and open features 562 to permit edges of each microelectronic element 512 to be distinguished and to facilitate alignment of each microelectronic subassembly within two dimensions. The alignment features 560, 562 may be aligned with the area of each underlying microelectronic element 512 such that the alignment features do not extend beyond the edges of each microelectronic element 512. Alternatively, some or all alignment features, e.g., feature 560' may be only partially aligned with the area of the microelectronic element 512, such that the alignment feature extends beyond an edge of the microelectronic element 512. In another variation, as shown with respect to microelectronic element 512', alignment features 560" and 562" are disposed at locations which lie beyond the edges 518', 519' of the microelectronic element 512'. Such alignment features 560", 562" may be aligned entirely or partially with the area that the later formed channels 46 (FIG. 9) will occupy. In this way, alignment features can be provided while at the same time permitting a compact layout to be achieved in the microelectronic elements.

The alignment features 560, 562 at the front face 517 of the first microelectronic subassembly 130 may be illuminated and detected by instruments disposed above the rear faces of microelectronic elements 12 that subassembly 130 when assembling a next subassembly 130A thereto in a process such as shown and described above (FIG. 7). Alternatively or in addition thereto, the alignment features 560, 562 at the front face 517 of the first microelectronic subassembly 130 and similar alignment features of the second microelectronic assembly 130A may be illuminated and detected by instruments disposed below the carrier layer 140 (FIG. 7) and below the front faces of microelectronic elements 12 of the first subassembly 130. In such case, the carrier layer 140 (FIG. 7) should have optical transmission characteristics that permit sufficient illumination by light passing through the thickness of the carrier layer 140.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of fabricating a plurality of stacked microelectronic units, comprising:
   a) providing a plurality of subassemblies each being a reconstituted wafer or portion of a reconstituted wafer and each having a front side and a rear side remote from the front side, each subassembly including a plurality of spaced apart microelectronic elements each including a semiconductor chip, the microelectronic elements having front faces exposed at the front side, contacts exposed at the front side, rear faces adjacent to the rear side, and edges extending between the front and rear faces, each subassembly further including a fill layer overlying the rear faces of the microelectronic elements and extending between the edges of adjacent microelectronic elements;
   b) forming a plurality of traces at the front side of each subassembly, the traces extending from the contacts to beyond the edges of the microelectronic elements;
   c) reducing a thickness of a first one of the subassemblies from the rear side to reduce a thickness of the microelectronic elements therein;
   d) joining a second one of the subassemblies with the first subassembly such that the front side of the second subassembly confronts the rear side of the first subassembly and such that the front faces of microelectronic elements of the second subassembly confront the rear faces of the microelectronic elements of the first subassembly;
   e) forming leads in at least one opening extending downwardly from the rear side of the second subassembly, the leads connected to the traces of the microelectronic elements of the first and second subassemblies, the at least one opening having an inclined wall at an angle relative to a normal direction with respect to the plane defined by the front faces of the microelectronic elements; and
   f) severing the joined microelectronic assemblies along edges of the microelectronic elements into stacked microelectronic units, such that edge surfaces of the microelectronic units include an inclined wall of the at least one opening, each microelectronic unit including leads extending along the surface of the at least one inclined wall.

2. A method as claimed in claim 1, wherein the microelectronic elements of the first subassembly are thinned until each microelectronic element therein reaches a thickness of less than about 50 microns between the front face and the rear face.

3. A method as claimed in claim 2, wherein the microelectronic elements of the first subassembly are thinned until each microelectronic element therein reaches a thickness of about 15 microns or less between the front face and the rear face.

4. A method as claimed in claim 1, wherein at least one of the microelectronic elements includes flash memory.

5. A method as claimed in claim 4, wherein each of the microelectronic elements includes flash memory.

6. A method as claimed in claim 1, wherein the traces extend along a passivation layer having openings aligned with the contacts.

7. A method as claimed in claim 1, further comprising thinning the second subassembly from the rear side to reduce a thickness of the microelectronic elements therein prior to forming the leads.

8. A method as claimed in claim 7, further comprising joining a third one of the subassemblies with the second subassembly such that the front side of the third subassembly confronts the rear side of the second subassembly, wherein step (e) includes forming leads connected to the traces of the microelectronic elements of the third subassembly.

9. A method as claimed in claim 8, further comprising grinding the third subassembly from the rear side thereof to reduce a thickness of the microelectronic elements therein and joining a fourth one of the subassemblies with the third subassembly such that the front side of the fourth subassembly confronts the rear side of the third subassembly, wherein step (e) includes forming leads connected to the traces of the microelectronic elements of the fourth subassembly.

10. A method as claimed in claim 7, wherein, prior to the step of grinding the second subassembly the thickness of the microelectronic elements of the second subassembly is substantially the same as a thickness of a wafer from which the microelectronic elements therein are obtained, prior to their incorporation in the second subassembly.

11. A method as claimed in claim 1, wherein step (e) includes forming the at least one opening as a plurality of channels extending in a lateral direction aligned with the plane defined by the front faces and along adjacent edges of the microelectronic elements.

12. A method as claimed in claim 11, wherein at least some of the leads extend in parallel paths spaced apart in the lateral direction along the inclined wall of one of the channels.

13. A method as claimed in claim 1, wherein step (e) includes forming a plurality of spaced apart openings in a lateral direction extending along edges of adjacent ones of the microelectronic elements and forming the leads in the spaced apart openings, each lead connected to a single one of the contacts.

14. A method as claimed in claim 1, wherein, at least prior to step (c), the fill layer covers the rear faces of the microelectronic elements.

15. A method as claimed in claim 1, further comprising, prior to step (c), attaching an element to the front side of the first subassembly.

16. A method as claimed in claim 15, wherein the element includes a packaging layer.

17. A method as claimed in claim 16, wherein the packaging layer electrically isolates the contacts from the front side of the first subassembly.

18. A method as claimed in claim 1, wherein, prior to step ,(b) the thickness of the microelectronic elements of the first subassembly is substantially the same as a thickness of a wafer from which the microelectronic elements therein are obtained, prior to their incorporation in the first subassembly.

19. A method of fabricating a plurality of stacked microelectronic units, comprising:
   a) providing a plurality of subassemblies each being a reconstituted wafer or portion of a reconstituted wafer and each having a front side and a rear side remote from the front side, each subassembly including a plurality of spaced apart microelectronic elements each including a semiconductor chip, the microelectronic elements having front faces exposed at the front side, contacts exposed at the front side, rear faces adjacent to the rear side, and edges extending between the front and rear faces, each subassembly further including a plurality of traces extending from the contacts to beyond the edges of the microelectronic elements and a fill layer overlying the rear faces of the microelectronic elements and extending between the edges of adjacent microelectronic elements;

b) reducing a thickness of a first one of the subassemblies from the rear side so as to reduce a thickness of the microelectronic elements therein;

c) joining a second one of the subassemblies with the first subassembly such that the front faces of the microelectronic elements of the second subassembly overlie and confront the rear faces of the microelectronic elements of the first subassembly; d) forming leads in at least one opening extending downwardly from the rear side of the second subassembly, the leads being conductively connected to the traces of the microelectronic elements of the first and second subassemblies, the at least one opening having an inclined wall at an angle relative to a normal direction with respect to the plane defined by the front faces of the microelectronic elements; and e) severing the joined microelectronic assemblies along edges of the microelectronic elements into stacked microelectronic units, such that edge surfaces of the microelectronic units include an inclined wall of the at least one opening, each microelectronic unit including leads extending along the surface of the at least one inclined wall.

20. A method as claimed in claim 19, wherein the fill layer includes a polymer.

21. A method as claimed in claim 19, wherein step (a) includes temporarily joining the front faces of a plurality of individual microelectronic elements to a carrier layer such that the edges of adjacent microelectronic elements are spaced apart by at least a predetermined spacing.

22. A method as claimed in claim 21, wherein step (a) further includes forming the fill layer by flowing an organic material at least into spaces between edges of adjacent joined microelectronic elements.

23. A method as claimed in claim 22, wherein step (a) further includes forming the traces after forming the fill layer.

24. A method as claimed in claim 19, wherein the front faces of the microelectronic elements of the first subassembly have at least one dimension different from a corresponding dimension of the front faces of the microelectronic elements of the second subassembly.

25. A method as claimed in claim 19, wherein a front face of a given microelectronic element of the first subassembly has at least one dimension different from a corresponding dimension of a front face of another microelectronic element of the first subassembly.

26. A method as claimed in claim 25, wherein front faces of a vertically stacked pair of microelectronic elements within the stacked assembly have at least substantially the same dimensions.

27. A method as claimed in claim 19, wherein each subassembly further includes alignment features adjacent to the front side.

28. A method as claimed in claim 27, wherein the alignment features and the traces are elements of a metal layer exposed at the front side.

29. A method as claimed in claim 19, wherein step (d) includes joining the second subassembly to the first subassembly such that edges of microelectronic elements of the second subassembly are displaced in a lateral direction relative to edges of microelectronic elements of the first subassembly in vertical alignment therewith, and the opening formed in step (e) has a sloped wall exposing the traces adjacent to the laterally displaced edges of the vertically stacked microelectronic elements.

30. A method as claimed in claim 29, wherein the lateral direction is a first lateral direction, the edges of each microelectronic element include first edges and second edges transverse to the first edges, and step (d) includes joining the second subassembly to the first subassembly such that second edges of microelectronic elements of the second subassembly are further displaced in a second lateral direction relative to second edges of microelectronic elements of the first subassembly in vertical alignment therewith, the second lateral direction being transverse to the first lateral direction, the method further comprising forming a second opening having a sloped wall exposing second traces adjacent to the second edges, and forming leads connected to the second traces.

31. A method of fabricating a stacked microelectronic unit, comprising:

a) stacking and joining a plurality of microelectronic elements, each of the microelectronic elements having a front face, a rear face remote from the front face, contacts exposed at the front face, edges extending between the front and rear faces and traces connected to the contacts extending along the front face towards the edges, the front faces of at least some of the microelectronic elements overlying and confronting the rear faces of other microelectronic elements; and b) forming a plurality of conductors extending along the edges of the microelectronic elements from the traces to unit contacts overlying and adjacent to rear faces of microelectronic elements of the at least some microelectronic elements.

32. A method of fabricating a stacked microelectronic unit as claimed in claim 31, wherein each of the plurality of microelectronic elements is included in a microelectronic subassembly containing a plurality of microelectronic elements arranged in an array, wherein step (a) includes stacking and joining a plurality of the microelectronic subassemblies and forming a plurality of openings extending between edges of stacked microelectronic elements therein.

33. A stacked microelectronic unit as claimed in claim 31, further comprising at least some unit contacts exposed at the bottom face, the unit contacts being connected to contacts on a front surface of at least one microelectronic element adjacent to the bottom face.

34. A stacked microelectronic unit, the stacked unit having a top face, unit contacts exposed at the top face and a bottom face remote from the top face, the stacked unit comprising:

a) a plurality of vertically stacked microelectronic elements each having a front surface, a rear surface, contacts exposed at the front surface, edges extending between the front and rear surfaces, traces connected to the contacts extending along the front surfaces towards the edges, the rear surface of at least one of the stacked microelectronic elements being adjacent to the top face of the microelectronic unit;

b) a plurality of conductors extending along the edges of the microelectronic elements from the traces to the top surface, the conductors conductively connected with the unit contacts, such that the unit contacts overlie the rear surface of the at least one microelectronic element adjacent to the top face.

35. A stacked microelectronic unit as claimed in claim 34, wherein the laterally displaced edges are first edges extending in a first direction, the edges of the microelectronic elements including second edges extending in a second direction transverse to the first direction, each of the first and second microelectronic elements having at least one second edge laterally displaced from an adjacent second edge of the other of the first and second microelectronic elements, the dielectric layer overlying the second edges of the microelectronic elements and extending along the second edges of the microelectronic elements to unit contacts.

36. A stacked microelectronic unit, comprising:
first and second vertically stacked microelectronic elements, each having a front surface defining a lateral direction, at least one edge extending away from the front surface, contacts exposed at the front surface, and traces extending from the contacts toward the edges, the front surface of the second microelectronic element at least partially overlying the front surface of the first microelectronic element, the second microelectronic element having at least one edge displaced in the lateral direction from an adjacent edge of the first microelectronic element;
a dielectric layer overlying the laterally displaced edges of the microelectronic elements, the dielectric layer defining an edge of the stacked unit; and
leads connected to traces at front faces of the microelectronic elements, the leads extending along the edges of the microelectronic elements to unit contacts.

37. A stacked microelectronic unit, comprising:
first and second vertically stacked microelectronic elements, wherein at least one first edge of the first microelectronic element at a first level extends beyond a corresponding first edge of the second microelectronic element at a second level overlying the first level;
a dielectric layer overlying the first edges of the first and second microelectronic elements, the dielectric layer defining a first edge of the stacked unit; and
conductive vias extending through the dielectric layer, the vias being connected to traces at front faces of the microelectronic elements.

38. A stacked microelectronic unit, comprising:
first and second vertically stacked microelectronic elements, wherein a front face of the first microelectronic element overlies at least one of a front face or a rear face of the second microelectronic element and at least one of a width or a length of the front faces of the first and second microelectronic elements differing;
a dielectric layer overlying the first edges of the first and second microelectronic elements; and
leads connected to traces at front faces of the microelectronic elements, the leads extending along a first edge of the stacked unit.

* * * * *